(12) United States Patent
Han et al.

(10) Patent No.: US 11,937,440 B2
(45) Date of Patent: Mar. 19, 2024

(54) ORGANIC ELECTROLUMINESCENT DEVICE

(71) Applicant: SOLUS ADVANCED MATERIALS CO., LTD., Iksan-si (KR)

(72) Inventors: Song Ie Han, Yongin-si (KR); Min Sik Eum, Yongin-si (KR); Jae Yi Sim, Yongin-si (KR); Yong Hwan Lee, Yongin-si (KR); Woo Jae Park, Yongin-si (KR); Tae Hyung Kim, Yongin-si (KR)

(73) Assignee: SOLUS ADVANCED MATERIALS CO., LTD., Iksan-si (KR)

( * ) Notice: Subject to any disclaimer, the term of this patent is extended or adjusted under 35 U.S.C. 154(b) by 619 days.

(21) Appl. No.: 16/643,365

(22) PCT Filed: Jul. 5, 2018

(86) PCT No.: PCT/KR2018/007642
§ 371 (c)(1),
(2) Date: Feb. 28, 2020

(87) PCT Pub. No.: WO2019/045252
PCT Pub. Date: Mar. 7, 2019

(65) Prior Publication Data
US 2020/0194706 A1   Jun. 18, 2020

(30) Foreign Application Priority Data

Aug. 29, 2017 (KR) .................. 10-2017-0109538

(51) Int. Cl.
*H01L 51/50* (2006.01)
*H10K 50/16* (2023.01)
(Continued)

(52) U.S. Cl.
CPC ........... *H10K 50/16* (2023.02); *H10K 50/171* (2023.02); *H10K 85/615* (2023.02);
(Continued)

(58) Field of Classification Search
CPC ............. H01L 51/5012; H01L 51/5016; H01L 51/0054; H01L 51/0055; H01L 51/0056;
(Continued)

(56) References Cited

U.S. PATENT DOCUMENTS

2014/0367645 A1* 12/2014 Seo ........................ H10K 85/649
257/40
2016/0141514 A1* 5/2016 Lee ........................ C07D 251/24
544/333
2016/0322583 A1* 11/2016 Kim ........................ C09K 11/025

FOREIGN PATENT DOCUMENTS

CN      105849227 A    8/2016
JP      2013-235846 A  11/2013
(Continued)

OTHER PUBLICATIONS

International Search Report for PCT/KR2018/007642 dated Oct. 2, 2018 [PCT/ISA/210].
(Continued)

*Primary Examiner* — Quinton A Brasfield
*Assistant Examiner* — Younes Boulghassoul
(74) *Attorney, Agent, or Firm* — Sughrue Mion, PLLC

(57) ABSTRACT

The present invention may provide an organic electroluminescent device which exhibits low driving voltage as well as high efficiency by including an electron transporting layer material having an improved electron transporting ability.

19 Claims, 1 Drawing Sheet

(51) Int. Cl.
*H10K 50/17* (2023.01)
*H10K 85/60* (2023.01)

(52) U.S. Cl.
CPC ......... *H10K 85/631* (2023.02); *H10K 85/636* (2023.02); *H10K 85/654* (2023.02); *H10K 85/6572* (2023.02); *H10K 85/6574* (2023.02); *H10K 85/6576* (2023.02)

(58) Field of Classification Search
CPC .............. H01L 51/0052; H01L 51/5072; H01L 51/0067; H01L 51/0072; H01L 51/0073; H01L 51/0074; H01L 51/0059; C07F 9/6512; H10K 50/16; H10K 85/615; H10K 85/631; H10K 85/654

See application file for complete search history.

(56) References Cited

FOREIGN PATENT DOCUMENTS

| | | | |
|---|---|---|---|
| JP | 2017503347 A | 1/2017 | |
| JP | 2019-501516 A | 1/2019 | |
| KR | 10-2015-0077284 A | 7/2015 | |
| KR | 10-2016-0047296 A | 5/2016 | |
| KR | 10-2016-0149041 A | 12/2016 | |
| KR | 10-2017-0048159 A | 5/2017 | |
| KR | 10-2017-0076426 A | 7/2017 | |
| KR | 20170076436 * | 7/2017 | ......... H01L 51/0072 |
| KR | 20170076436 A1 * | 7/2017 | ......... H01L 51/0072 |
| WO | WO-2018012718 A1 * | 1/2018 | ........... C07D 251/24 |

OTHER PUBLICATIONS

Written Opinion for PCT/KR2018/007642 dated Oct. 2, 2018 [PCT/ISA/237].

* cited by examiner

ORGANIC ELECTROLUMINESCENT DEVICE

CROSS REFERENCE TO RELATED APPLICATIONS

This application is a National Stage of International Application No. PCDKR2018/007642 filed Jul. 5, 2018, claiming priority based on Korean Patent Application No, 10-2017-0109538 filed Aug. 29, 2017.

TECHNICAL FIELD

The present invention relates to an organic electroluminescent device capable of achieving both low driving voltage and high efficiency by including an electron transporting layer material that has an improved electron transporting ability.

DISCUSSION OF RELATED ART

In 1965, studies on organic electroluminescent devices (hereinafter, "organic EL devices") led to blue electroluminescence which uses anthracene monocrystals, and in 1987, Tang suggested an organic EL device in a two-layered stack structure which includes a hole layer (NPB) and an emissive layer ($Alq_3$). Afterwards, in order to realize high efficiency and long life characteristics required for commercialization of organic EL devices, a multilayer stack structure that includes, for example, organic layers responsible for hole injection and transporting, organic layers responsible for electron injection and transporting, and an organic layer responsible for inducing combination of the holes and electrons to cause electroluminescence, each having distinctive and subdivided functions, has been suggested. The introduction of the multilayer stack structure improved the performance of the organic EL devices up to the level of commercialization, and such a multilayer stack structure has been expanding its application range from portable radio display products in 1997 to portable information display devices and TV display devices.

The demand for larger displays and higher resolutions has led to challenges, for example, high efficiency and long lifespan, for the organic EL devices. Particularly, the high resolution that may be realized by forming more pixels in the same area results in a decrease in a light emitting area of an organic EL pixel, thus inevitably reducing the lifetime, which has become one of the most important technical problems to be overcome for the organic EL device.

In the organic EL device, when current or voltage is applied to two electrodes, holes are injected into an organic layer at an anode, and electrons are injected into the organic layer at a cathode. When the injected holes and electrons meet, an exciton is formed, and the exciton falls to the ground state, resulting in light emission. Such organic EL devices may be classified, according to an electron spin type of the formed excitons, into fluorescent EL devices in which singlet excitons contribute to light emission and phosphorescent EL devices in which triplet excitons contribute to light emission.

In terms of the electron spin of the excitons that are formed by recombination of electrons and holes, 25% of singlet excitons and 75% of triplet excitons are produced. In the fluorescent EL devices which emit light by singlet excitons, the internal quantum efficiency may not theoretically exceed 25% depending on the production ratio, and the external quantum efficiency is regarded to have a limitation of 5%. The phosphorescent EL devices which emit light by triplet excitons may improve luminous efficiency by up to four times compared to fluorescence, when metal complex compounds containing transition metal heavy atoms such as Ir and Pt are used as phosphorescent dopants.

As described above, although the phosphorescent EL devices exhibit higher efficiency than fluorescence in terms of luminous efficiency based on the theoretical fact, in the case of blue phosphorescent devices, except green and red, the development level for phosphorescent dopants having deep blue color purity and high efficiency and hosts having a broad energy gap to satisfy such phosphorescent dopants is insufficient, and thus blue phosphorescent devices have not been commercialized yet, and blue fluorescent devices have been used in products.

In order to improve such characteristics of the organic EL device, research results to increase the stability of the organic EL device by preventing diffusion of holes into an electron transporting layer have been reported. However, to date, no satisfactory result has been obtained.

DETAILED DESCRIPTION OF THE INVENTION

Technical Objectives

The present invention is directed to providing an organic EL device including an electron transporting layer material having an improved electron transporting ability, thereby achieving high efficiency and low voltage as well as long life characteristics.

Technical Solution to the Problem

In order to achieve the above objectives, the present invention provides an organic EL device including a stack structure in which an anode, a hole transporting area; an emissive layer (a light-emitting layer); an electron transporting area; and a cathode are sequentially stacked, where the electron transporting area comprises an electron transporting layer and an electron injection layer, where the electron transporting layer comprises a compound represented by the following Chemical Formula 1:

[Chemical Formula 1]

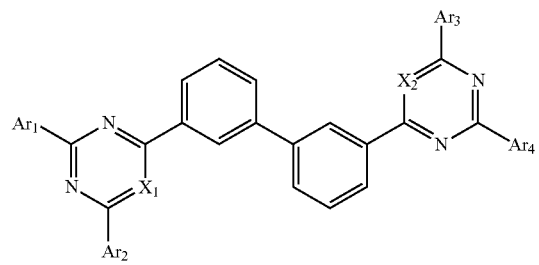

where in Chemical Formula 1, $X_1$ and $X_2$ may be the same or different from each other and are each independently $CR_1$ or N, and when $X_1$ and $X_2$ are both $CR_1$, the plurality of $R_1$ are the same or different from each other, $R_1$ may be selected from the group consisting of hydrogen, deuterium, halogen, a cyano group, a $C_1$ to $C_{40}$ alkyl group, a $C_6$ to $C_{60}$ aryl group and a heteroaryl group having 5 to 60 nuclear atoms;

$Ar_1$ to $Ar_4$ may be each independently selected from the group consisting of: a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, while a case where all of $Ar_1$ to $Ar_4$ are the same as each other is excluded, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ may be optionally each independently substituted or unsubstituted with one or more kinds of substituents selected from the group consisting of deuterium, halogen, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{60}$ alkylsilyl group, a $C_6$ to $C_{60}$ arylsilyl group, a $C_1$ to $C_{60}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and provided that when the substituents is present in a plural number, they are optionally the same or different from each other.

In addition, the present invention provides an organic EL device including a stack structure in which an anode, a hole transporting area; an emissive layer; an electron transporting area; and a cathode are sequentially stacked, where the electron transporting area comprises an auxiliary electron transporting layer, an electron transporting layer and an electron injection layer, and where the electron transporting layer comprises a compound represented by the above Chemical Formula 1.

Effects of the Invention

The present invention may provide an organic EL device having a low driving voltage and a high luminous efficiency by introducing an electron transporting layer material having an improved electron transporting ability. In addition, the present invention may provide a display panel having improved performance and lifespan by applying the organic EL device into the display panel.

DESCRIPTION OF MAIN REFERENCE NUMERALS OF DRAWINGS

Figure 1:
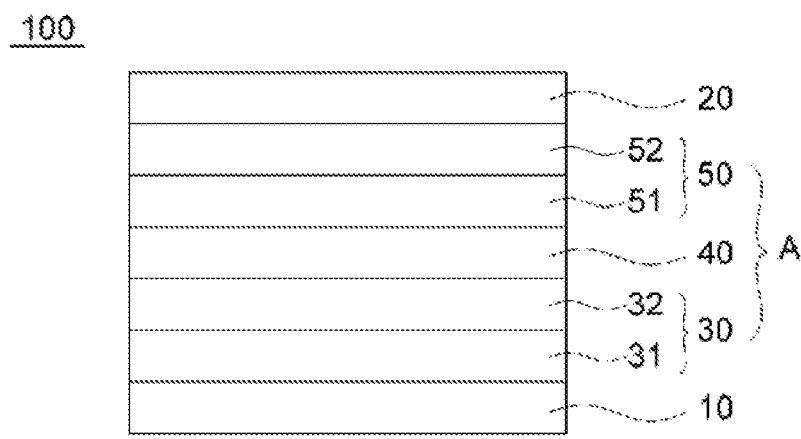
FIG. 1 is a cross-sectional view illustrating a structure of an organic EL device according to an embodiment of the present invention.

100, 200: an organic electroluminescence device
A, A': an organic material layer
10: an anode
20: a cathode
30: a hole transporting area
31: a hole injection layer
32: a hole transporting layer
40: an emissive layer (light-emitting layer)
50: an electron transporting area
51: an electron transporting layer
52: an electron injection layer
53: an auxiliary electron transporting layer

MODES FOR CARRYING OUT THE INVENTION

Hereinafter, embodiments of the present invention will be described in detail

The present invention is related to an organic EL device that includes an anode, a cathode, and an organic layer between the anode and the cathode, where the organic layer includes a hole transporting area, an emissive layer (a light-emitting layer), an electron transporting area, and the compound represented by the above Chemical Formula 1 is included in the electron transporting area, preferably in an electron transporting layer.

The compound represented by Chemical Formula 1 is electrochemically stable because it has a structure in which two 6-membered heterocycles (e.g., pyrimidine and triazine) having excellent electron withdrawing group (EWG) properties are linked to each other through a biphenylene linker with meta-meta bonding connectivity. In such a case, the biphenylene linker causes a twisted structure which is bent in zigzags with respect to a major axis of the compound, thereby extending a distance between two EWG moieties to minimize interactions between the two EWG moieties. Accordingly, the compound of the present invention in which the biphenylene linker is introduced is electrochemically and stereo-chemically stable and has a wide bandgap energy.

In addition, the biphenylene linker with meta-meta connectivity is also effective in suppressing crystallization of an organic layer, and thus a device including the compound of Chemical Formula 1 according to the present invention may greatly improve durability and lifespan characteristics.

Meanwhile, electrons move in the organic EL device along a LUMO level, and the electron transporting layer (ETL) forms a LUMO step between the cathode and the emissive layer to help the electrons to be smoothly injected from the cathode to the emissive layer. Accordingly, when a LUMO value of an electron transporting layer material is 2.5 eV or more, electrons may be smoothly transported from the cathode to the emissive layer. In practice, since the compound represented by Chemical Formula 1 of the present invention has a LUMO value of 2.5 eV or more, it may reliably perform the role of the electron transporting layer.

Hereinafter, preferred embodiments of the organic EL device according to the present invention will be described with reference to the accompanying drawings. However, embodiments of the present invention may be modified in various other forms, and the scope of the present invention is not limited to the embodiments described below.

FIG. 1 is a view illustrating a structure of an organic EL device according to an embodiment of the present invention.

The organic EL device according to a first embodiment of the present invention includes the compound represented by the above Chemical Formula 1 as an ETL material.

Referring to FIG. 1, an organic EL device 100 includes an anode 10, a cathode 20, an emissive layer 40 located between the anode 10 and the cathode 20, a hole transporting area 30 located between the anode 10 and the emissive layer 40, and an electron transporting area 50 located between the emissive layer 40 and the cathode 20, where the electron transporting area 50 includes an electron transporting layer 51 and an electron injection layer 52.

Anode

In the organic EL device 100 according to the present invention, the anode 10 serves to inject holes into an organic layer A.

A material forming the anode 10 is not particularly limited, and conventional materials known in the art may be used. Non-limiting examples thereof may include metals such as vanadium, chromium, copper, zinc and gold, alloys thereof, metal oxides such as zinc oxide, indium oxide, indium tin oxide (ITO) and indium zinc oxide (IZO), a combination of a metal and an oxide such as ZnO:Al and $SnO_2$:Sb, conductive polymers such as polythiophene, poly(3-methylthiophene), poly[3,4-(ethylene-1,2-dioxy)thiophene] (PEDT), polypyrrole and polyaniline, and carbon black.

A method of manufacturing the anode 10 is also not particularly limited and it may be prepared according to conventional methods known in the art. As an example, a method of coating an anode material on a substrate formed of a silicon wafer, quartz, a glass plate, a metal plate or a plastic film may be used.

Cathode

In the organic EL device 100 according to the present invention, the cathode 20 serves to inject electrons into the organic layer A.

A material forming the cathode 20 is not particularly limited, and conventional materials known in the art may be used. Non-limiting examples thereof may include metals such as magnesium, calcium, sodium, potassium, titanium, indium, yttrium, lithium, gadolinium, aluminum, silver, tin, and lead, alloys thereof, and multilayer-structured materials such as LiF/Al and $LiO_2$/Al.

In addition, a method of manufacturing the cathode 20 is not also particularly limited and it may be prepared according to conventional methods known in the art.

Organic Layer

The organic layer A included in the organic EL device according to the present invention may use, without limitation, any conventional configuration used in an organic layer of conventional organic EL devices, and may include one or more selected from the hole transporting area 30, the emissive layer 40, and the electron transporting area 50. In such a case, in consideration of the characteristics of the organic EL device, it is preferable to include all the above-mentioned organic layers.

Hole Transporting Area

The hole transporting area 30 included in the organic layer A of the present invention serves to move the holes injected from the anode 10 to the emissive layer 40. The hole transporting area 30 may include one or more selected from the group consisting of a hole injection layer 31 and a hole transporting layer 32. In such a case, in consideration of the characteristics of the organic EL device, it is preferable to include both the hole injection layer 31 and the hole transporting layer 32 described above.

Materials forming the hole injection layer 31 and the hole transporting layer 32 are not particularly limited, and any hole injection/transporting layer material known in the art may be used without limitation as long as it has a low hole injection barrier and a high hole mobility. Non-limiting examples thereof may include arylamine derivatives. In such a case, the materials forming the hole injection layer 31 and the hole transporting layer 32 may be the same as or different from each other.

Emissive Layer

The emissive layer 40 included in the organic layer A of the present invention is a layer in which holes and electrons meet to form excitons, and a color of light emitted by the organic EL device may vary depending on the material forming the emissive layer 40.

Such an emissive layer 40 may include a host and a dopant, and a mixing ratio thereof may be appropriately adjusted within a range known in the art. For example, the host may be included in a range of 70 to 99.9 percent by weight (hereinafter, "wt %"), and the dopant may be included in a range of 0.1 to 30 wt %. More specifically, when the emissive layer 40 is blue fluorescence, green fluorescence, or red fluorescence, the host may be included in a range of 80 to 99.9 wt %, and the dopant may be included in a range of 0.1 to 20 wt %. In addition, when the emissive layer 40 is blue fluorescence, green fluorescence or red phosphorescence, the host may be included in a range of 70 to 99 wt % and the dopant may be included in a range of 1 to 30 wt %.

The host included in the emissive layer 40 of the present invention is not particularly limited as long as it is known in the art, and non-limiting examples thereof may include alkali metal complex compounds, alkaline earth metal complex compounds, or condensed aromatic cyclic derivatives. More specifically, the host material is preferably aluminum complex compounds, beryllium complex compounds, anthracene derivatives, pyrene derivatives, triphenylene derivatives, carbazole derivatives, dibenzofuran derivatives, dibenzothiophene derivatives, or a combination of one or more kinds thereof that may enhance luminous efficiency and lifespan.

In addition, the dopant included in the emissive layer 40 of the present invention is not particularly limited as long as it is known in the art, and non-limiting examples thereof may include anthracene derivatives, pyrene derivatives, arylamine derivatives, and metal complex compounds including iridium (Ir) or platinum (Pt).

The emissive layer 40 described above may be formed as a single layer structure or a multilayer structure including two or more layers. When the emissive layer 40 includes a plurality of layers, the organic EL device may emit light of various colors. Specifically, the present invention may provide an organic EL device having a mixed color by providing a plurality of emissive layers, formed of respectively different materials, in series. In addition, when the plurality of emissive layers is included, a driving voltage of the device increases, but a current value in the organic EL device becomes constant, thereby providing an organic EL device having improved luminous efficiency by the number of emissive layers.

Electron Transporting Area

In the organic EL device 100 according to the present invention, the electron transporting area 50 included in the organic layer A serves to move the electrons injected from the cathode 20 to the emissive layer 40.

Such an electron transporting area 50 may include one or more selected from the group consisting of the electron transporting layer 51 and the electron injection layer 52. In such a case, in consideration of the characteristics of the organic EL device, it is preferable to include both the electron transporting layer 51 and the electron injection layer 52 described above. In particular, in the present invention, the compound represented by Chemical Formula 1 may be included as a material for forming the electron transporting layer 51.

Specifically, the compound represented by Chemical Formula 1 has a structure, as a base skeleton, in which two EWGs are connected to each other through a linker. In such an embodiment, the two EWGs each are pyrimidine and triazine, and the linker is m,m-biphenylene. Since the compound represented by Chemical Formula 1 has a structure in which two 6-membered heterocycles (pyrimidine and triazine) having excellent EWG properties are linked to each other through a linker, it is electrochemically stable and has excellent electron transport properties as well as high triplet energy, high glass transition temperature and excellent thermal stability. The compound represented by Chemical Formula 1 may have an improved glass transition temperature by having a significantly increased molecular weight of the compound, and accordingly, may have a higher thermal stability than the conventional single 6-membered heterocyclic compound.

In addition, the compound represented by Chemical Formula 1 may also exhibit effects of inhibiting crystallization of the organic layer by using the m,m-biphenylene linker. For this reason, an organic EL device to which the compound represented by Chemical Formula 1 is applied may have significantly improved durability and lifespan characteristics. In such a case, the organic EL device to which the compound represented by Chemical Formula 1 that has m,m-biphenylene as a linker is applied may exhibit excellent driving voltage, light emission peak and current efficiency, as compared to organic EL devices to which a compound that has p,p-biphenylene or m,p-biphenylene as a linker is applied.

In addition, the compound represented by Chemical Formula 1 shows long lifespan characteristics while being very advantageous for electron transporting. The excellent electron transporting ability of such a compound may achieve high efficiency and speedy mobility in the organic EL device and may easily control HOMO and LUMO energy levels according to the direction or location of substituents.

According to an embodiment, the compound represented by Chemical Formula 1 may have a LUMO of 2.5 eV or more and an energy difference ($E_{HOMO}-E_{LUMO}$) between HOMO and LUMO of 3.2 eV or more.

Specifically, the compound represented by Chemical Formula 1 according to the present invention may be represented by the following Chemical Formula 2 or 3.

[Chemical Formula 2]

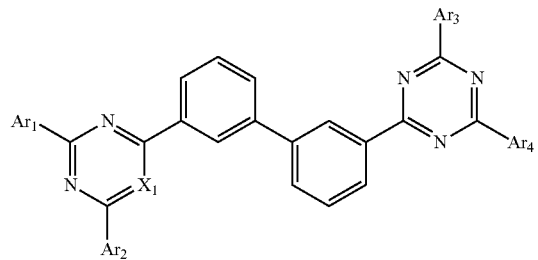

[Chemical Formula 3]

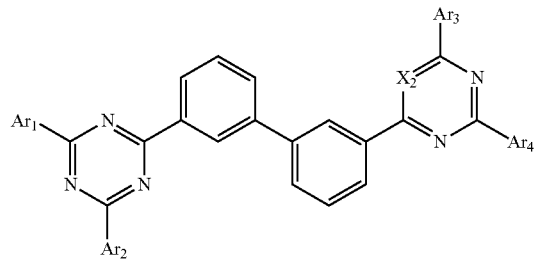

In Chemical Formulas 2 and 3, $X_1$ and $X_2$ and $Ar_1$ to $Ar_4$ are the same as those defined in Chemical Formula 1, respectively.

In a preferred embodiment according to the present invention, at least one of $X_1$ and $X_2$ may be N. More preferably, one of $X_1$ and $X_2$ may be $CR_1$ and the other thereof may be N.

In another preferred embodiment of the present invention, $Ar_1$ to $Ar_4$ may each independently be selected from the group consisting of a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group. More preferably, $Ar_1$ to $Ar_4$ may each be a $C_6$ to $C_{60}$ aryl group and/or a heteroaryl group having 5 to 60 nuclear atoms. In an embodiment, when one to three of $Ar_1$ to $Ar_4$ are a $C_6$ to $C_{60}$ aryl group (e.g., a phenyl group), the rest thereof may be a $C_6$ to $C_{60}$ aryl group and/or a heteroaryl group having 5 to 60 nuclear atoms, and alternatively, $Ar_1$ to $Ar_4$ may all be $C_6$ to $C_{60}$ aryl group.

The alkyl group, the aryl group, the heteroaryl group, the aryloxy group, the arylphosphine oxide group and the arylamine group of $Ar_1$ to $Ar_4$ may be each independently substituted or unsubstituted with one or more kinds of substituents selected from the group consisting of deuterium, a halogen group, a cyano group, a nitro group, a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and when the substituents are plural in number, the substituents are the same as or different from each other.

In the present invention, $Ar_1$ to $Ar_4$ may be each be more specifically embodied by a substituent selected from the following structural Formulas, except for the case where $Ar_1$ to $Ar_4$ are all the same as each other.

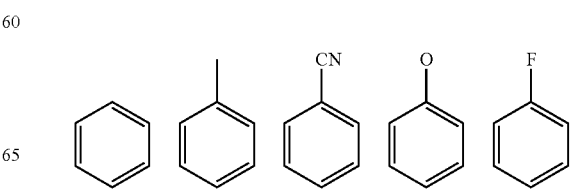

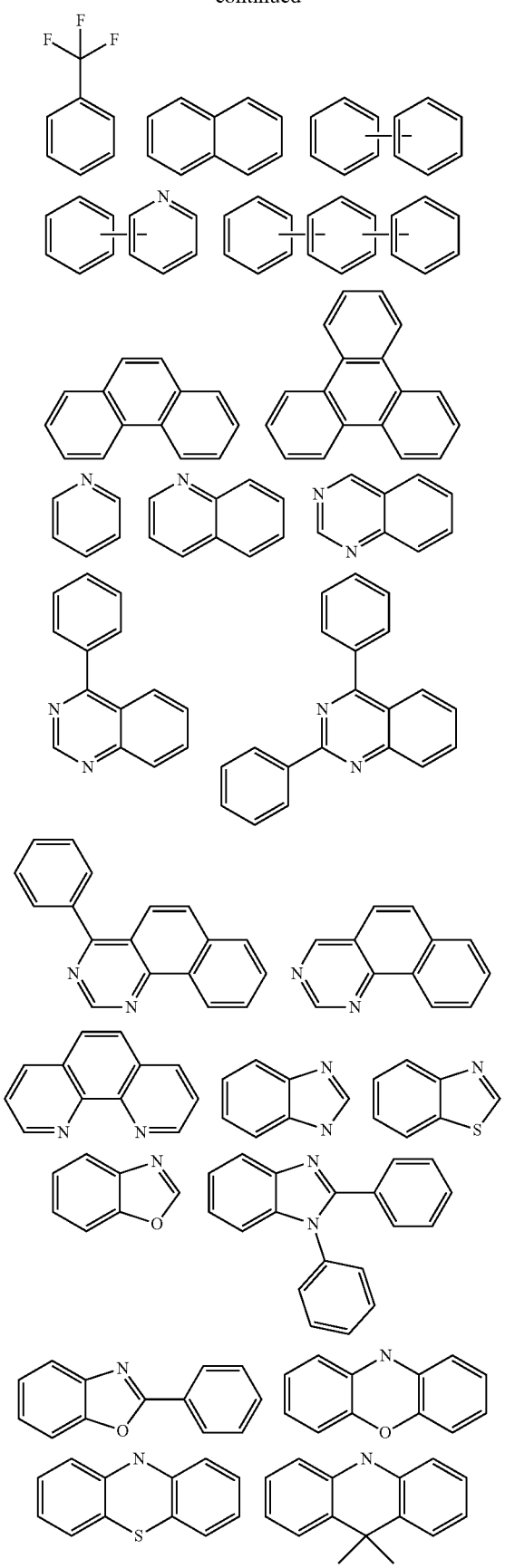
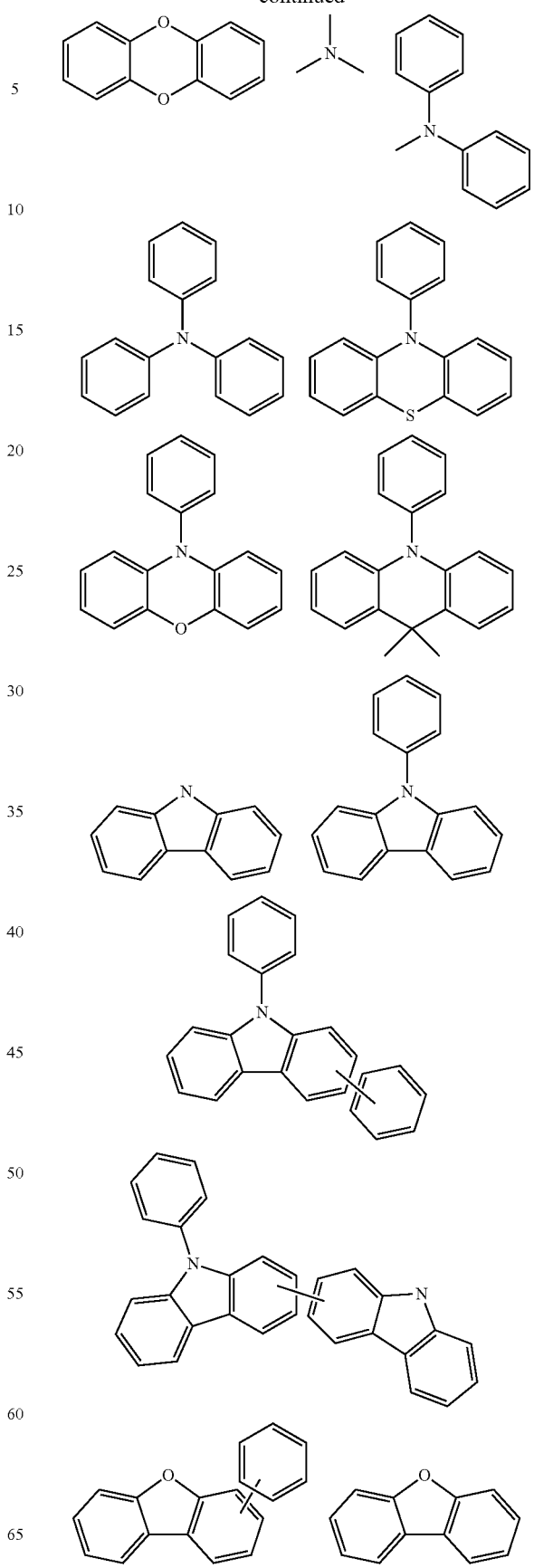

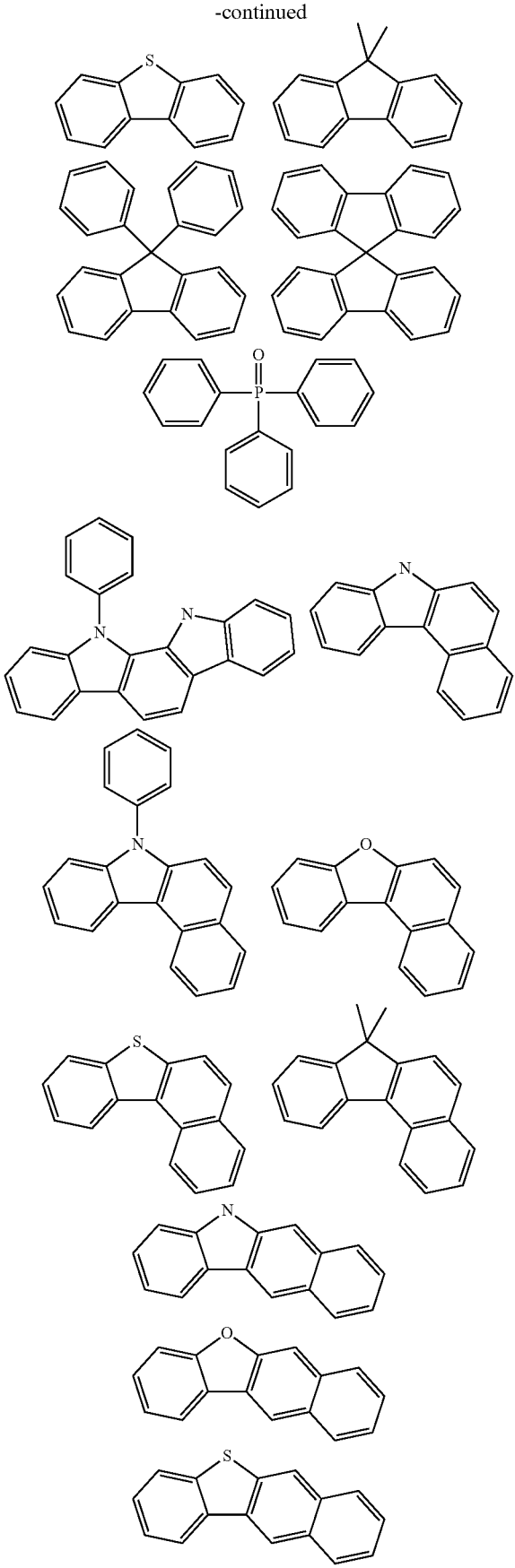
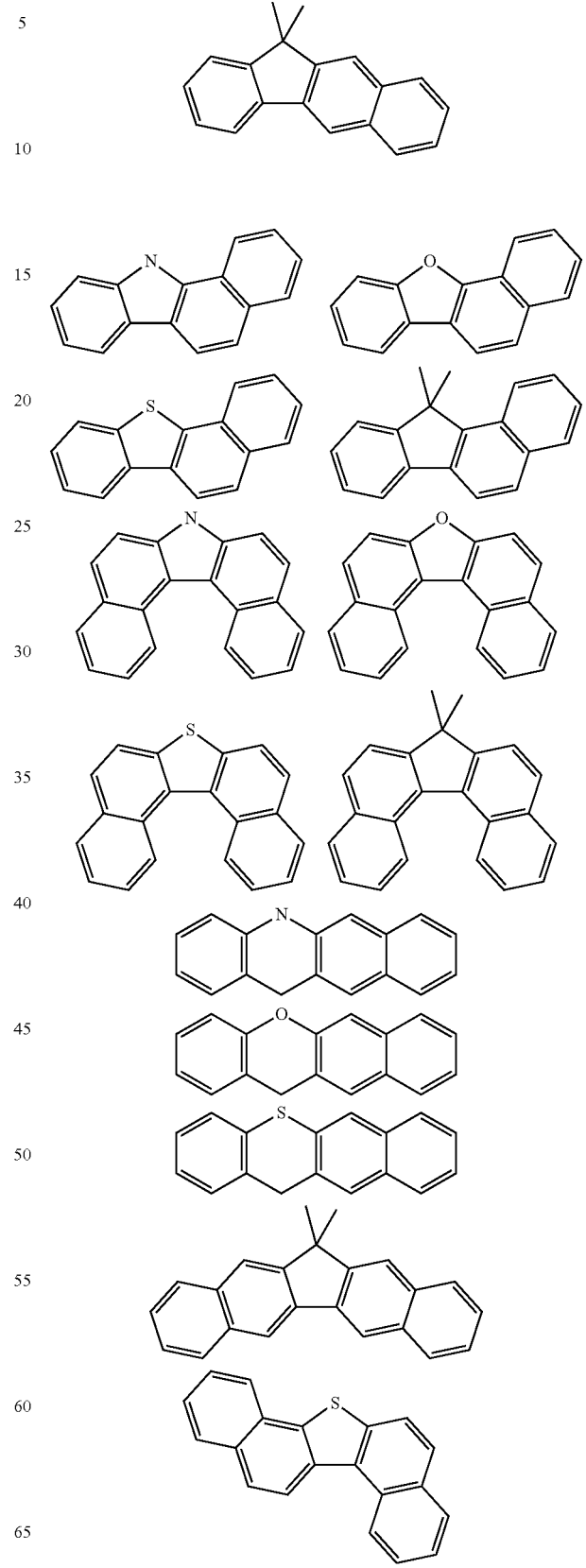

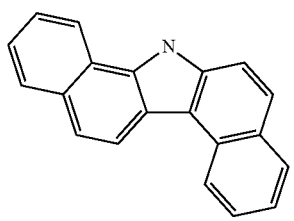

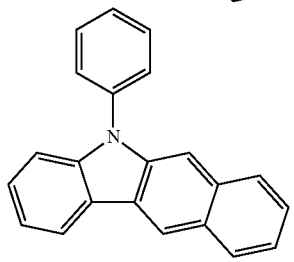

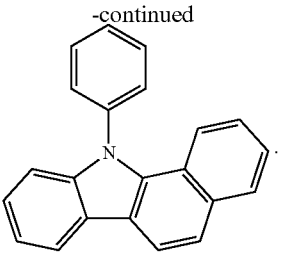

A site at which the substituent exemplified by the above structural formulae is not particularly limited, and the substituent may be appropriately linked to Chemical Formula 1 by selecting a general linking position known in the art.

The compound represented by Chemical Formula 1 according to the present invention described above may be further embodied into a compound represented by any one of the following compounds ET-01 to ET-21 illustrated below. However, the compound represented by Chemical Formula 1 of the present invention is not limited by those illustrated below.

ET-01

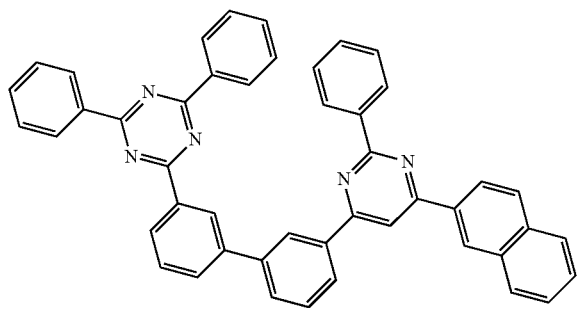

ET-02

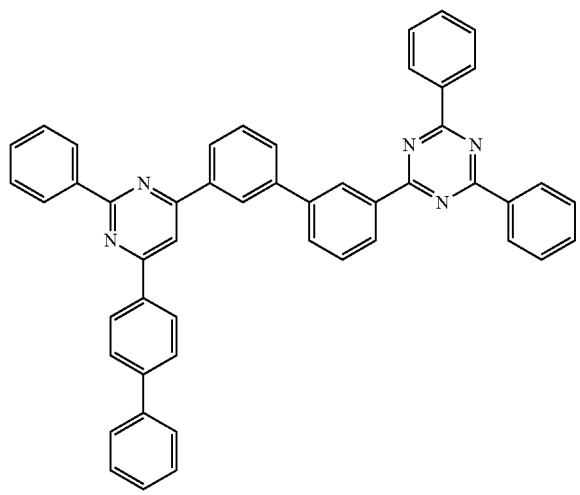

ET-03

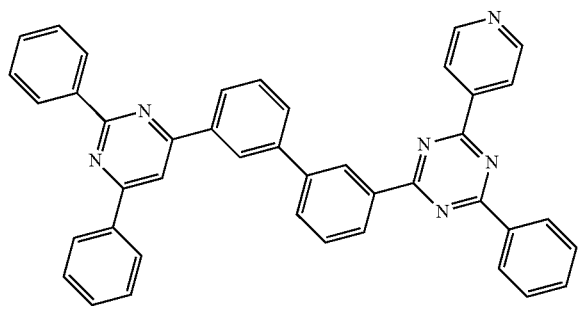

ET-04

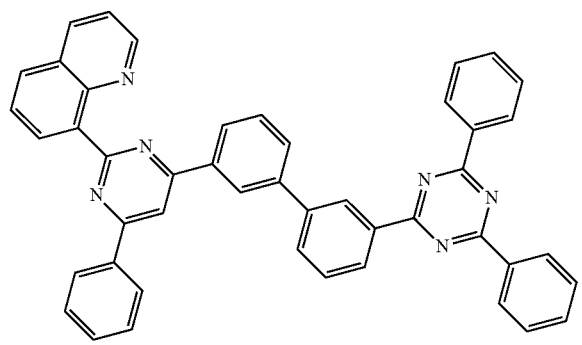

-continued
ET-05
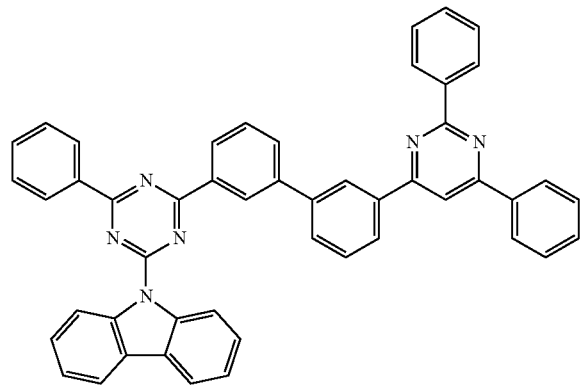
ET-06
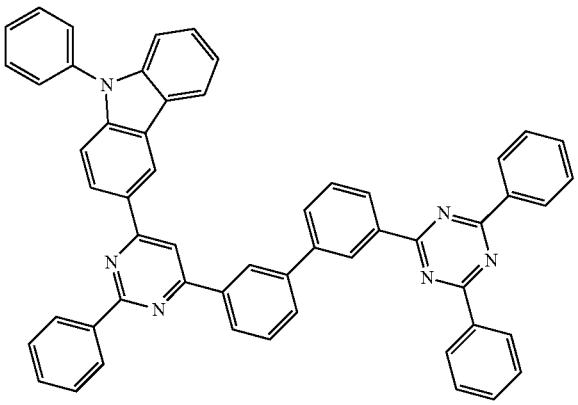
Et-07
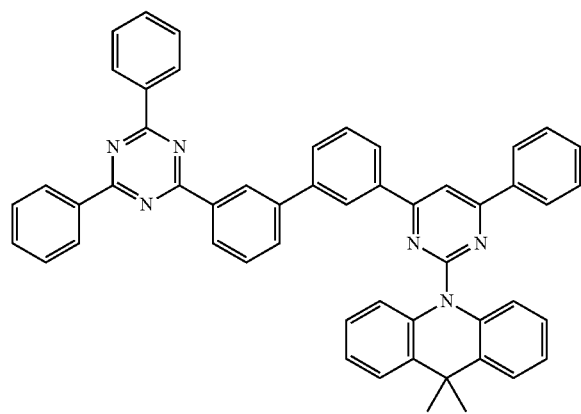
ET-08
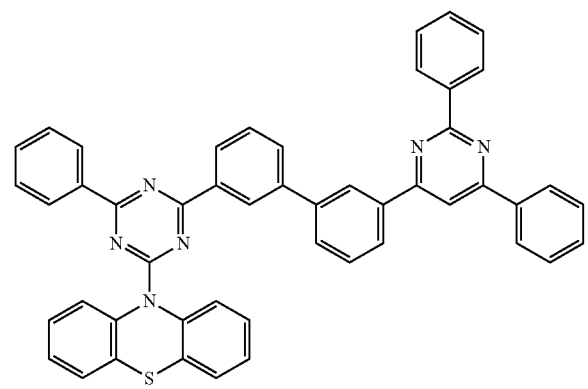
ET-09
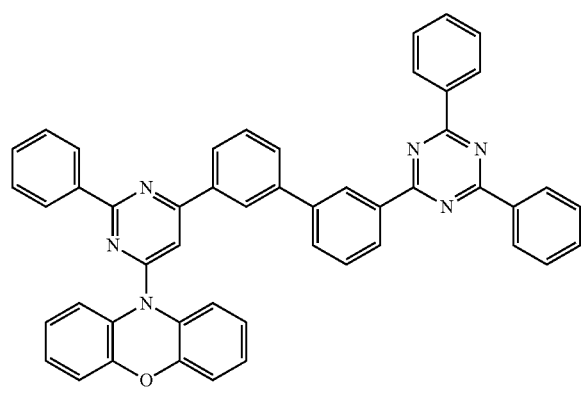
ET-10
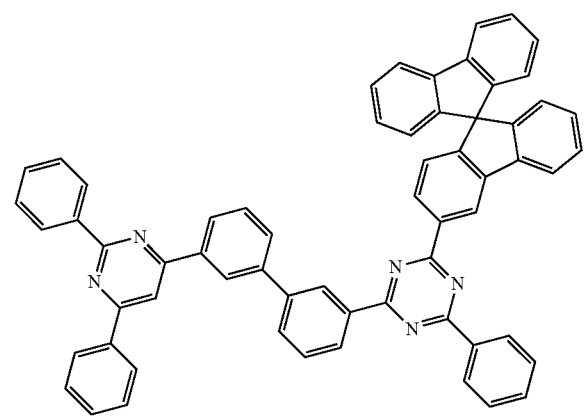

-continued
ET-11
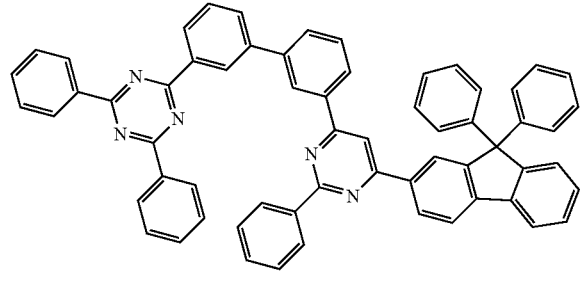
ET-12
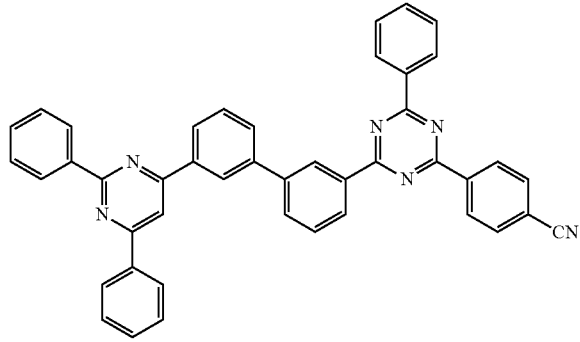
ET-13
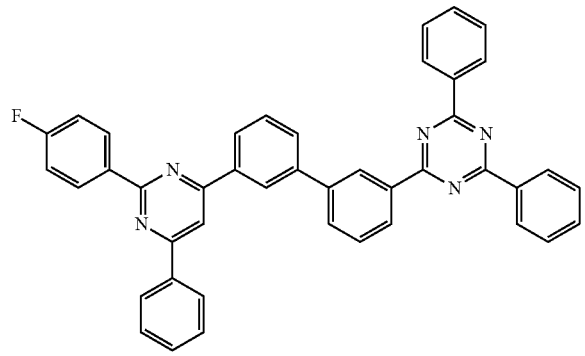
ET-14
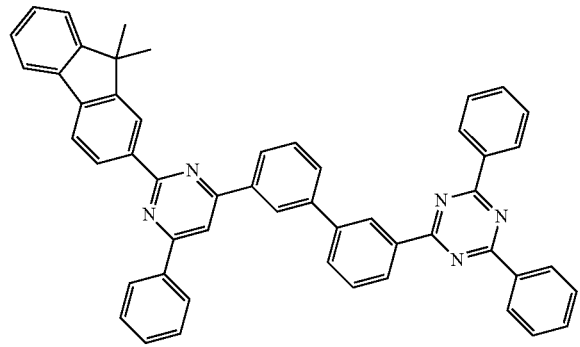
ET-15
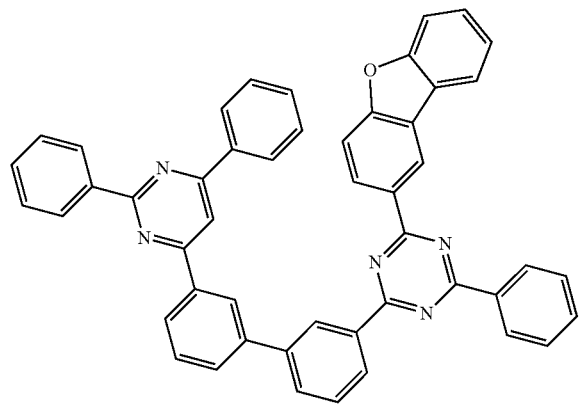
ET-16
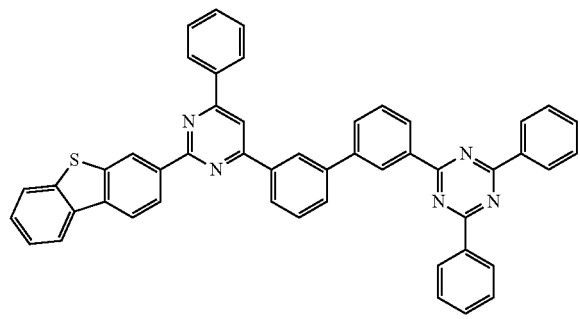

-continued
ET-17
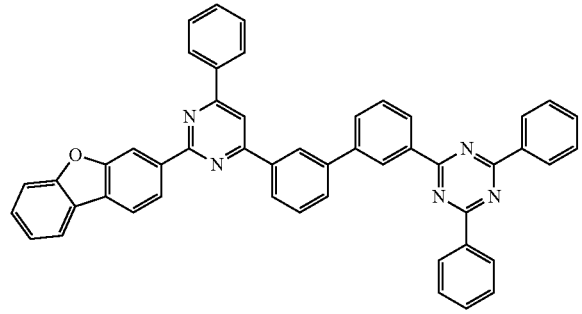
ET-18
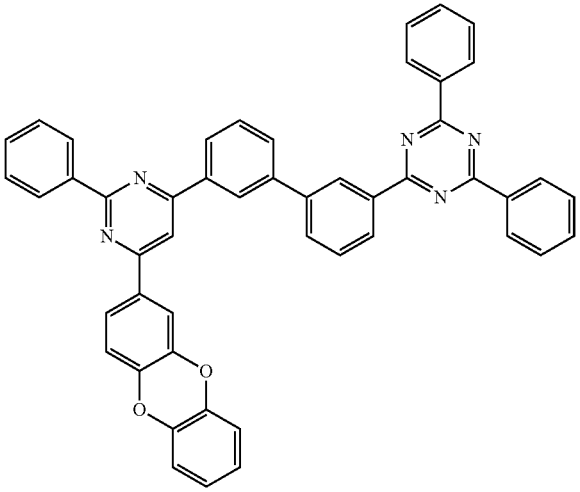
ET-19
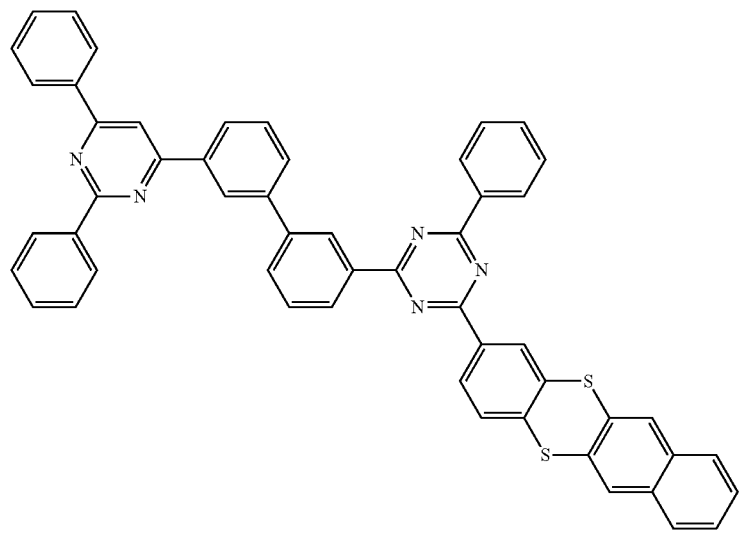
ET-20
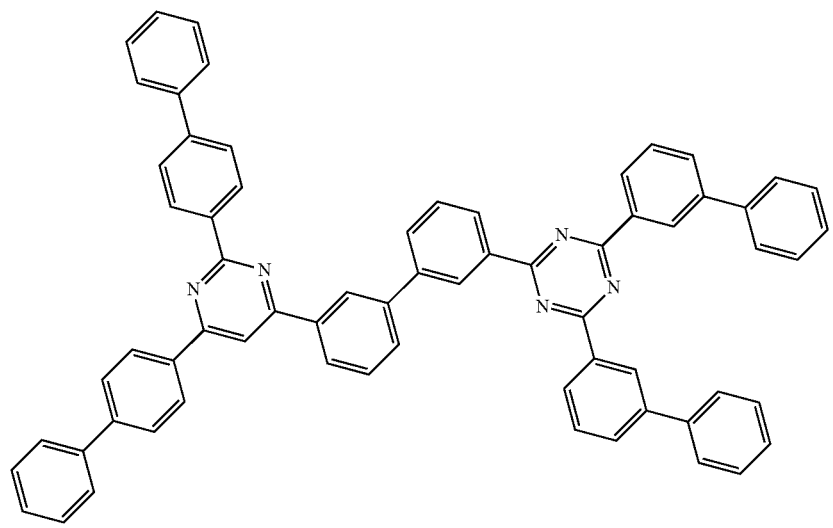

ET-21

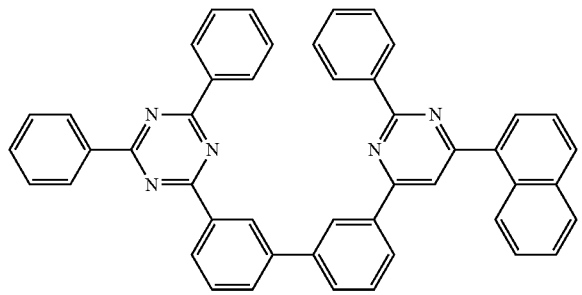

In the electron transporting area 50 of the present invention, a material forming the electron injection layer 52 is not particularly limited as long as it facilitates injection of electrons and has a high electron mobility, and non-limiting examples thereof may include the above bipolar compounds, anthracene derivatives, heteroaromatic compounds, alkali metal complex compounds and the like.

More specifically, the electron transporting area 50 of the present invention, more specifically, the electron transporting layer 51 and/or the electron injection layer 52, may be co-deposited with n-type dopants to facilitate the injection of electrons from the cathode. In such a case, any alkali metal complex compound known in the art may be used without limitation as the n-type dopants, and examples thereof may include alkali metals, alkaline earth metals or rare earth metals.

Figure 2:
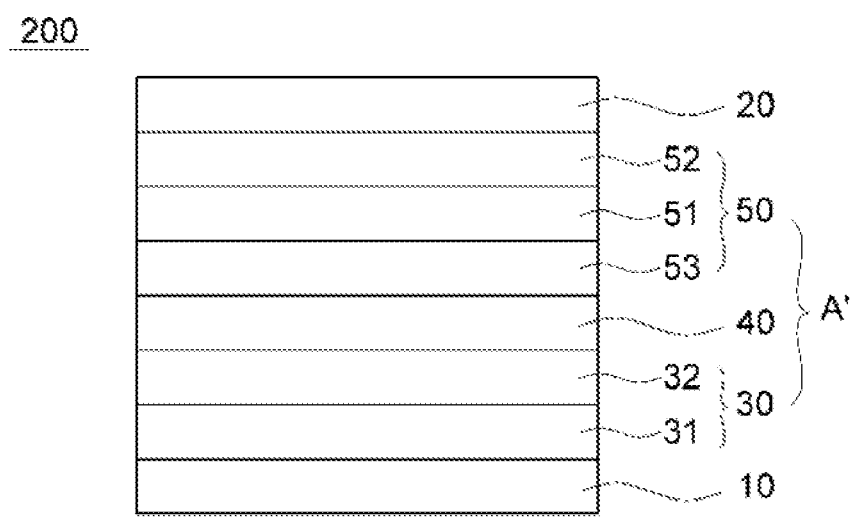
FIG. 2 is a cross-sectional view illustrating a structure of an organic EL device according to another embodiment of the present invention.

FIG. 2 is a view illustrating a structure of an organic EL device according to another embodiment of the present invention.

Referring to FIG. 2, an organic EL device 200 includes an anode 10, a cathode 20, an emissive layer 40 located between the anode 10 and the cathode 20, a hole transporting area 30 located between the anode 10 and the emissive layer 40, and an electron transporting area 50 located between the emissive layer 40 and the cathode 20, where the electron transporting area 50 has a structure including an auxiliary electron transporting layer 53, an electron transporting layer 51, and an electron injection layer 52.

The organic EL device 200 according to a second embodiment of the present invention includes the auxiliary electron transporting layer 53 formed of a bipolar compound having an ionization potential of 5.5 eV or more, in addition to the electron transporting layer 51 containing the compound of Chemical Formula 1 described above.

Auxiliary Electron Transporting Layer

In the organic EL device 200 according to the present invention, the auxiliary electron transporting layer 53 serves to prevent holes from diffusing or moving to the electron transporting layer 51, and thus the lifetime of the organic EL device may be improved. That is, the holes are blocked by a high energy barrier of the auxiliary electron transporting layer 53 and do not diffuse or move to the electron transporting layer 51, thus remaining in the emissive layer 40.

A material forming the auxiliary electron transporting layer 53 may be a conventional bipolar compound know in the art that has both an EWG moiety and an electron donating group (EDG) moiety.

More specifically, the bipolar compound forming the auxiliary electron transporting layer 53 may have an ionization potential of 5.5 eV or more, specifically in a range of 5.5 to 7.0 eV, preferably in a range of 5.5 to 6.5 eV.

That is, the holes move along an ionization potential level in the organic EL device, and when the holes diffuse or move to the electron transporting layer 51 beyond the emissive layer 40, an irreversible decomposition reaction occurs by oxidation, resulting in a reduction in the lifetime of the organic EL device. In contrast, in the present embodiment, by providing the auxiliary electron transporting layer 53 formed of the bipolar compound having an ionization potential [Ip] of 5.5 eV or more, holes are prevented from diffusing or moving to the electron transporting layer 51, thereby improving the lifespan of the organic EL device.

In addition, a difference ($E_{HOMO}-E_{LUMO}$) between a HOMO value and a LUMO value of the bipolar compound may be 3.0 eV or more, specifically in a range of 3.0 eV or more and 3.5 eV or less. In addition, the bipolar compound has a difference (ΔFst) between a singlet energy $S_1$ and a triplet energy $T_1$ of less than 0.5 eV, specifically in a range of less than 0.5 eV and 0.01 eV or more.

In an embodiment, since the bipolar compound has the difference ($E_{HOMO}-E_{LUMO}$) between the HOMO value and the LUMO value of 3.0 eV or more and has the difference (ΔEst) between the singlet energy $S_1$ and the triplet energy $T_1$ of less than 0.5 eV, when it is used in the auxiliary transporting layer 53, the excitons formed in the emissive layer 40 may be prevented from diffusing into the electron transporting layer 51, and the phenomenon of light emission at an interface between the emissive layer 40 and the electron transporting layer 51 may be prevented. Accordingly, it is possible to prevent spectral mixing of the organic EL device and to improve stability, thereby improving the lifespan of the organic EL device.

More specifically, the bipolar compound includes both of the EWG which has a large electron absorptivity and the EDG which has a large electron donating properties, thereby having a characteristic of separating electron clouds of HOMO and LUMO. Accordingly, since the difference (ΔEst) between the triplet energy and the singlet energy of the compound is small, a relationship of ΔEst<0.5 eV is satisfied, and thus a high triplet energy (T1) may be achieved even when the difference ($E_{HOMO}-E_{LUMO}$) between the HOMO value and the LUMO value is 3.0 eV or more.

The bipolar compound which is included as a material of the auxiliary electron transporting layer 53 of the present embodiment is formed by combining the EWG moiety and the EDG moiety. In such a case, the EWG is characterized in that it includes one or more EWG moiety represented by the following Chemical Formula 4:

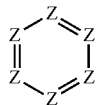

[Chemical Formula 4]

in Chemical Formula 4,

Z may be the same as or different from each other, and each independently be C(R) or N, and at least one of Z may be N, where a plurality of R may be the same as or different from each other, and may each independently be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, or may form a condensed ring with an adjacent group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of R may each independently be substituted or unsubstituted with one or more kinds of substituents selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

In the present invention, the EWG moiety may be more specifically embodied into structures represented by the following Chemical Formulas, and it is preferable that the EWG moiety is a 6-membered heteroaromatic hydrocarbon including 1 to 3 nitrogens. Non-limiting examples of the preferred EWG moieties may include pyridine, pyrimidine, triazine, pyrazine and the like.

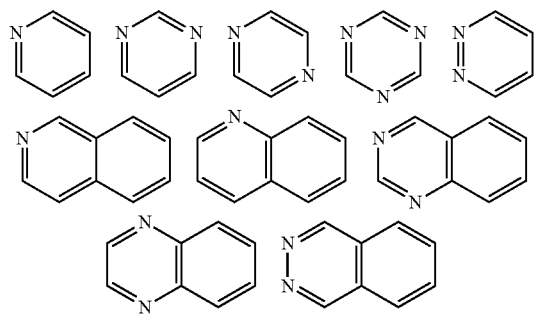

The bipolar compound included as a material of the auxiliary electron transporting layer 53 of the present invention includes a common EDG moiety, known in the art, having higher electron donating properties than that of the EWG of the above Chemical Formula 4.

Non-limiting examples of such moieties having EDG properties may include a condensed heteroaromatic ring such as indole, carbazole, azepine, furan, thiophene, dibenzofuran, and dibenzothiophene, or a condensed polycyclic aromatic ring such as biphenyl, triphenylene, fluoranthene, and fluorene, and more specifically, they may be represented by the following Chemical Formula 5.

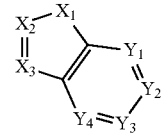

[Chemical Formula 5]

In Chemical Formula 5, $X_1$ may be selected from the group consisting of O, S, Se, $N(Ar_1)$, $C(Ar_2)(Ar_3)$, and $Si(Ar_4)(Ar_5)$, $Y_1$ to $Y_4$ may be the same as or different from each other and may each independently be N or $C(R_1)$, where the plurality of $R_1$ are the same as or different from each other, even though they are represented as being the same as each other, and they may form a condensed ring with an adjacent group;

$X_2$ and $X_3$ may be the same as or different from each other and may each independently be N or $C(R_2)$, where the plurality of $R_2$ are the same as or different from each other, even though they are represented as being the same as each other, and they may form a condensed ring (e.g., a condensed aromatic ring or condensed heteroaromatic ring), $R_1$ to $R_2$ and $Ar_1$ to $Ar_5$ may be the same as or different from each other, and may each independently be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of $R_1$ to $R_2$ and $Ar_1$ to $Ar_5$ may each independently be substituted or unsubstituted with one or more kinds of substituents selected from the group consisting of deuterium, a halogen group, a cyano group, a nitro group, an amino group, a $C_1$ to $C_{40}$ alkyl group, a $C_1$ to $C_{40}$ alkenyl group, a $C_1$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

In the present invention, Chemical Formula 5 may be more specifically embodied into one of the following A-1 to A-24. However, embodiments are not limited thereto.

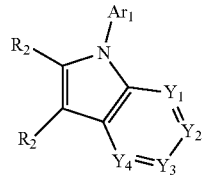
A-1

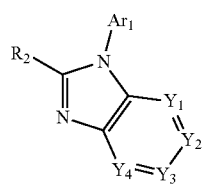
A-2

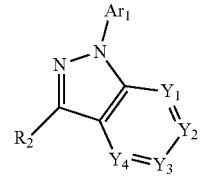
A-3

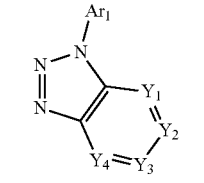
A-4

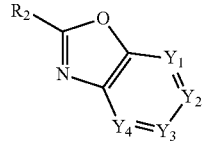
A-5

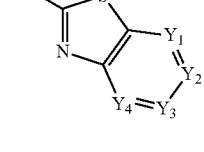
A-6

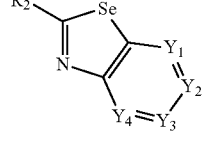
A-7

-continued

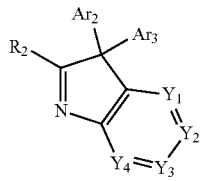
A-8

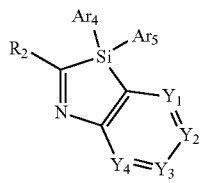
A-9

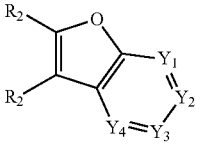
A-10

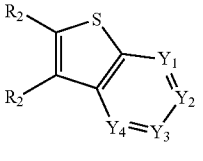
A-11

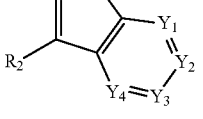
A-12

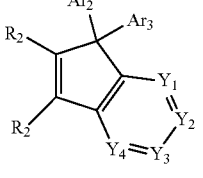
A-13

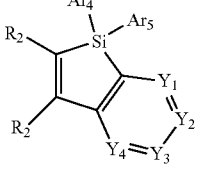
A-14

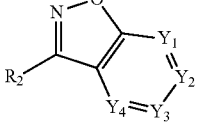
A-15

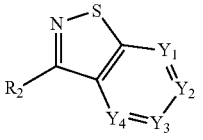
A-16

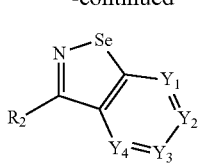

A-17

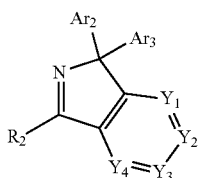

A-18

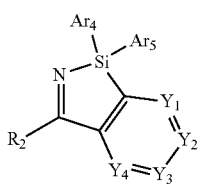

A-19

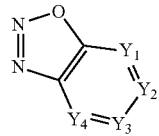

A-20

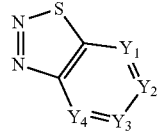

A-21

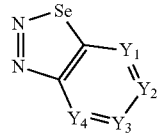

A-22

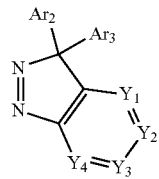

A-23

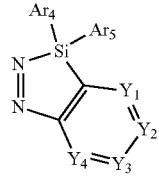

A-24

In the above A-1 to A-24, definitions of $R_2$, $Y_1$ to $Y_4$ and, $Ar_1$ to $Ar_5$ are the same as those of Chemical Formula 5 described above.

In an embodiment, in the bipolar compound of the present invention, the EDG moiety may be solely used as the structure of Chemical Formula 5, or as a structure in which Chemical Formula 5 and Chemical Formula 6, or Chemical Formula 5 and Chemical Formula 7 are combined to be condensed.

More specifically, in Chemical Formula 5, $Y_1$ to $Y_4$ may each independently be N or $C(R_1)$, and when $Y_1$ to $Y_4$ are a plurality of $C(R_1)$, one of $Y_1$ and $Y_2$, $Y_2$ and $Y_3$ or $Y_3$ and $Y_4$ form a condensed ring with Chemical Formula 6. In such a case, the plurality of $R_1$ may be the same as or different from each other. In addition, when both $X_2$ and $X_3$ in Chemical Formula 5 are $C(R_2)$, the plurality of $R_2$ may be combined with the following Chemical Formula 6 or Chemical Formula 7, respectively, to form condensed rings.

[Chemical Formula 6]

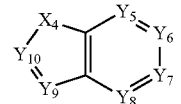

[Chemical Formula 7]

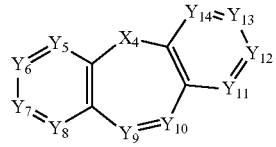

In Chemical Formula 6 and Chemical Formula 7, $Y_5$ to $Y_{14}$ may be the same as or different from each other and may each independently be N or $C(R_3)$, and when $C(R_3)$ are plural in number, the plurality of $R_3$ are the same as or different from each other, and may form a condensed ring with Chemical Formula 5, $X_4$ may be the same as $X_1$, and in such a case, a plurality of $Ar_1$ to $Ar_5$ are the same as or different from each other.

the plurality of $R_3$ that do not form a condensed ring may be the same as or different from each other, even though they are represented as being the same as each other, and they may each independently be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of $R_3$ may each independently be substituted or unsubstituted with one or more kinds of substituents selected from the group consisting of deuterium, a halogen group, a cyano group, a nitro group, an amino group, a $C_1$ to $C_{40}$ alkyl group, a $C_1$ to $C_{40}$ alkenyl group, a $C_1$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

In the present invention, the bipolar compound formed by condensation of Chemical Formula 5 and Chemical Formula 6 may be embodied into any one of the following Chemical Formulas B-1 to B-30. However, embodiments are not limited thereto. In such a case, the following Chemical Formulas B-1 to B-30 include one or more condensed indole or condensed carbazole moiety to have strong EDG properties with large electron donating properties.

B-1
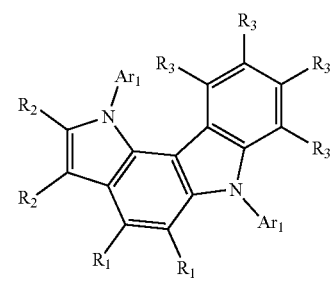

B-2
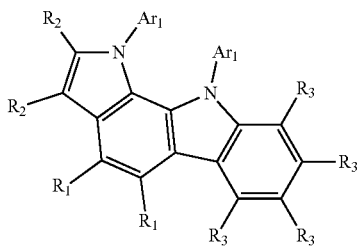

B-3
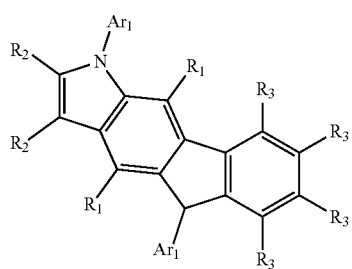

B-4
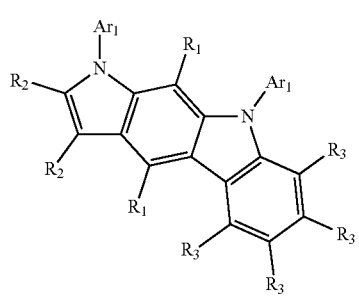

B-5
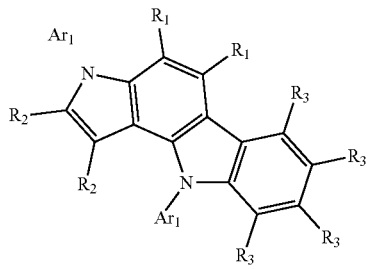

B-6
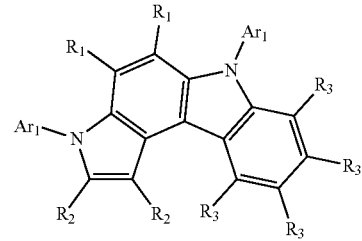

B-7
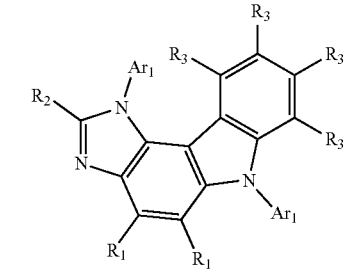

B-8
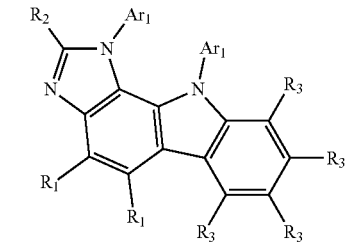

B-9
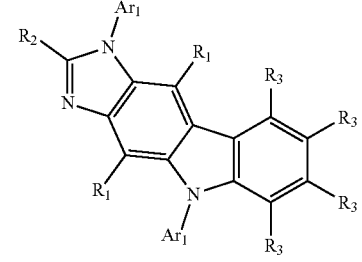

B-10
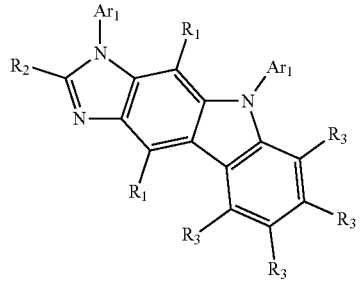

B-11
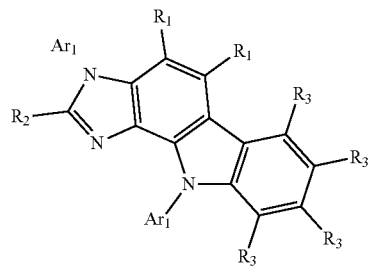
B-12
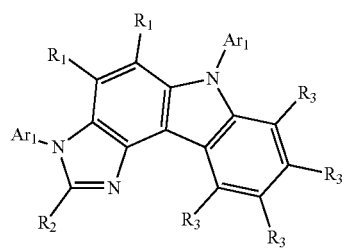
B-13
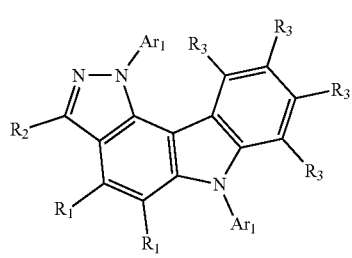
B-14
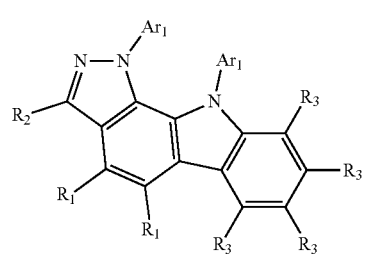
B-15
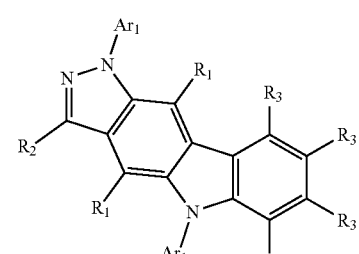
B-16
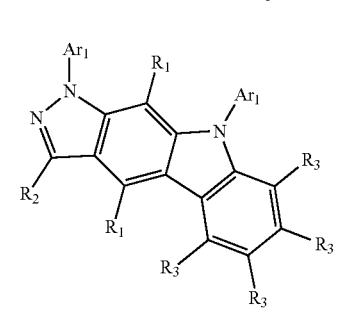
B-17
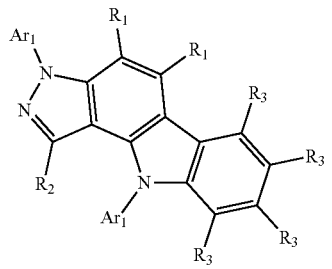
B-18
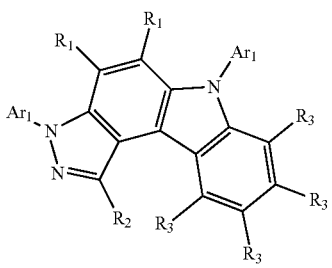
B-19
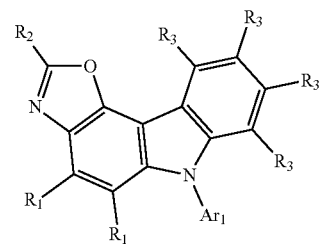
B-20
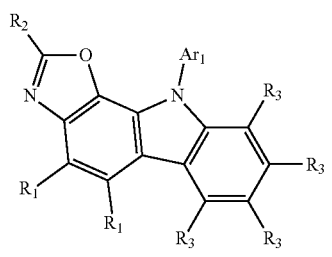
B-21
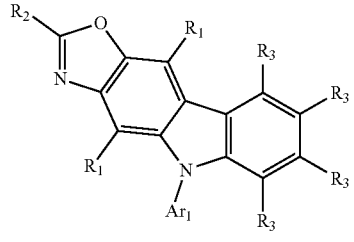
B-22
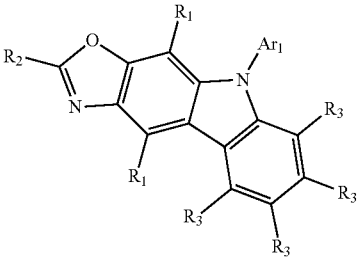

B-23 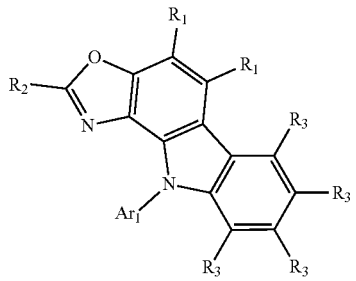

B-24 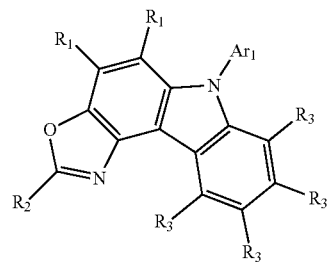

B-25 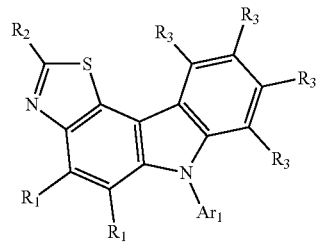

B-26 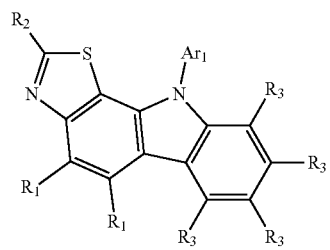

B-27 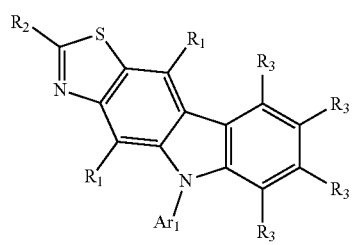

B-28 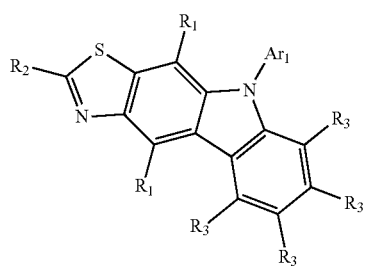

B-29 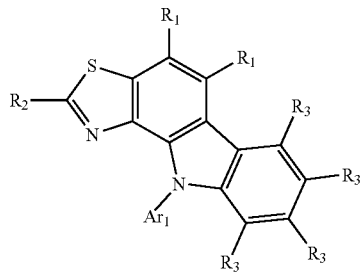

B-30 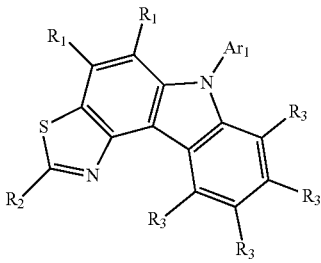

In Chemical Formulas B-1 to B-30, $Ar_1$ and $R_1$ to $R_3$ are the same as defined in Chemical Formulas 5 and 6.

As a preferred embodiment of the present invention, $Ar_1$ is a substituted or unsubstituted $C_6$ to $C_{40}$ aryl group, or a substituted or unsubstituted heteroaryl group having 5 to 40 nuclear atoms, and it is preferable that $R_1$ to $R_3$ are each independently hydrogen, a substituted or unsubstituted $C_1$ to $C_{40}$ alkyl group, a substituted or unsubstituted $C_6$ to $C_{40}$ aryl group, or a substituted or unsubstituted heteroaryl group having 5 to 40 nuclear atoms.

In addition, in the present invention, the bipolar compound formed by condensation of Chemical Formula 5 and Chemical Formula 7 may be embodied into any one of the compounds represented by the following Chemical Formulas 5a to 5h. In such a case, the Chemical Formulas represented by the following 5a to 5h have strong EDG characteristics with large electron donating properties by including one or more condensed azepine moieties.

[Chemical Formula 5a]

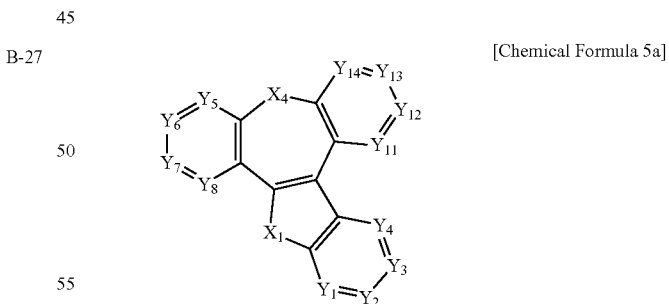

[Chemical Formula 5b]

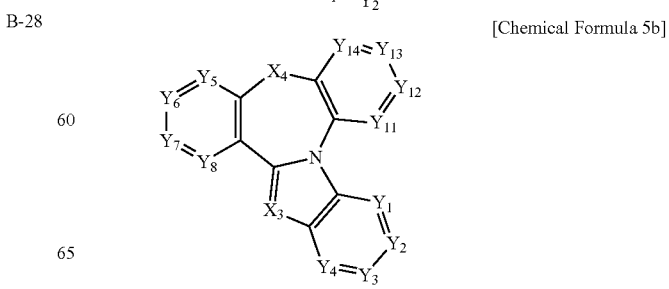

[Chemical Formula 5c]

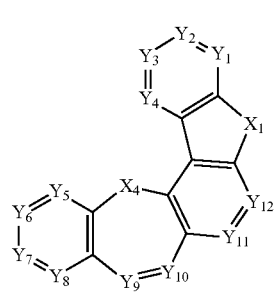

[Chemical Formula 5d]

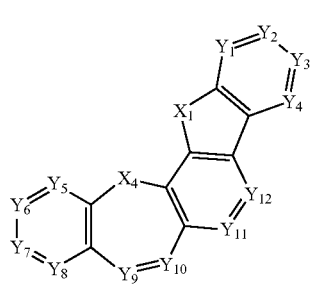

[Chemical Formula 5e]

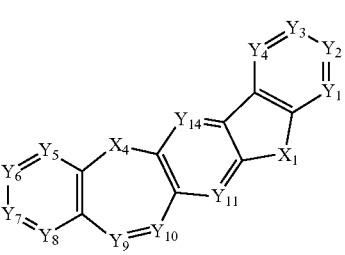

[Chemical Formula 5f]

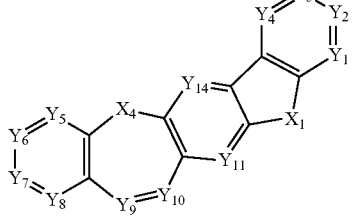

[Chemical Formula 5g]

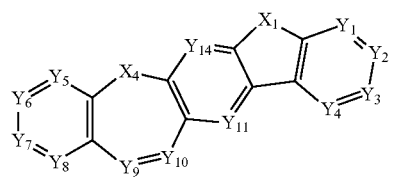

[Chemical Formula 5h]

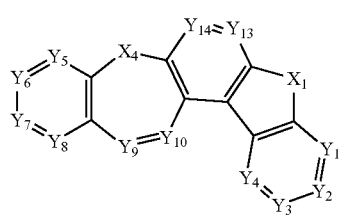

In Chemical Formulas 5a to 5h, $X_1$, $X_3$ to $X_4$, and $Y_1$ to $Y_{14}$ are the same as defined in Chemical Formulas 5 and 7.

More specifically, $X_1$ and $X_4$ are the same as or different from each other, preferably each independently being O, S or $N(Ar_1)$, and more preferably each being $N(Ar_1)$, where the plurality of $Ar_1$ are the same as or different from each other, $Y_1$ to $Y_4$ are the same as or different from each other, each independently being N or $C(R_1)$, preferably each of $Y_1$ to $Y_4$ being $C(R_1)$, and in such a case, the plurality of $R_1$ are the same as or different from each other.

$X_3$ are each independently N or $C(R_2)$.

$Y_5$ to $Y_{14}$ are the same as or different from each other, each independently being N or $C(R_3)$, preferably each of $Y_5$ to $Y_{14}$ being $C(R_3)$, and in such a case, the plurality of $R_3$ are the same as or different from each other. As used herein, $Ar_1$ and $R_1$ to $R_3$ are the same as defined in Chemical Formula 5 and Chemical Formula 7.

In Chemical Formulas 5a to 5h according to the present invention, it is preferable that $X_1$ and $X_4$ are each independently $N(Ar_1)$ or S. That is, it is preferable that $X_1$ is $N(Ar_1)$ and $X_4$ is S, or $X_1$ is S and $X_4$ is $N(Ar_1)$, or both of $X_1$ and $X_4$ are $N(Ar_1)$.

In addition, it is preferable that $Ar_1$ is a $C_6$ to $C_{60}$ aryl group or a heteroaryl group having 5 to 60 nuclear atoms and that $Ar_2$ to $Ar_5$ are the same as or different from each other, each independently being a substituted or unsubstituted $C_1$ to $C_{40}$ alkyl group (specifically, a methyl group) or a substituted or unsubstituted $C_6$ to $C_{60}$ aryl group (specifically, a phenyl group).

In the compounds represented by the above Chemical Formulas 5a to 5h, at least one of $R_1$ to $R_3$ and $Ar_1$ to $Ar_5$ forms a bond with the moiety having EWG characteristics with high electron absorptivity.

In the bipolar compound according to the present invention, the EDG moiety may be represented by the structure of Chemical Formula 8.

[Chemical Formula 8]

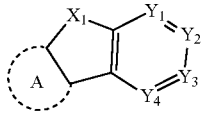

In Chemical Formula 8, $X_1$ may be selected from the group consisting of O, S, Se, $N(Ar_1)$, $C(Ar_2)(Ar_3)$, and $Si(Ar_4)(Ar_5)$, $Y_1$ to $Y_4$ may be the same as or different from each other, each independently being N or $C(R_1)$, and zero to two of $Y_1$ to $Y_4$ may be N, where the plurality of $R_1$ are the same as or different from each other and may form a fused aromatic ring or a fused heteroaromatic ring with an adjacent group, $R_1$ and $Ar_1$ to $Ar_5$ may be the same as or different from each other, and may each independently be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, and an A ring may be a monocyclic or polycyclic alicyclic ring, a monocyclic or polycyclic heteroalicyclic ring, a monocyclic or polycyclic aromatic ring, or a monocyclic or polycyclic heteroaromatic ring, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of $R_1$ and $Ar_1$ to $Ar_5$ may each independently be substituted or unsubstituted with one or more kinds of substituents selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

In the present invention, the A ring may be a hydrocarbon-based ring including one or more conventional hydrocarbon-based or heteroatoms (e.g., N, O, S, Si, etc.) known in the art, and may be in a condensed, fused, crosslinked, or spirocyclic bonding form with another adjacent ring. For example, the A ring may be selected from the group consisting of: a monocyclic or polycyclic alicyclic ring, a monocyclic or polycyclic heteroalicyclic ring, a monocyclic or polycyclic aromatic ring, or a monocyclic or polycyclic heteroaromatic ring. Specifically, the A ring is preferably a $C_6$ to $C_{18}$ aromatic ring or a heteroaromatic ring having 5 to 18 nuclear atoms.

In the present invention, the EDG moiety of Chemical Formula 8 may be more specifically embodied into, but not limited to, a structure represented by the following Chemical Formula:

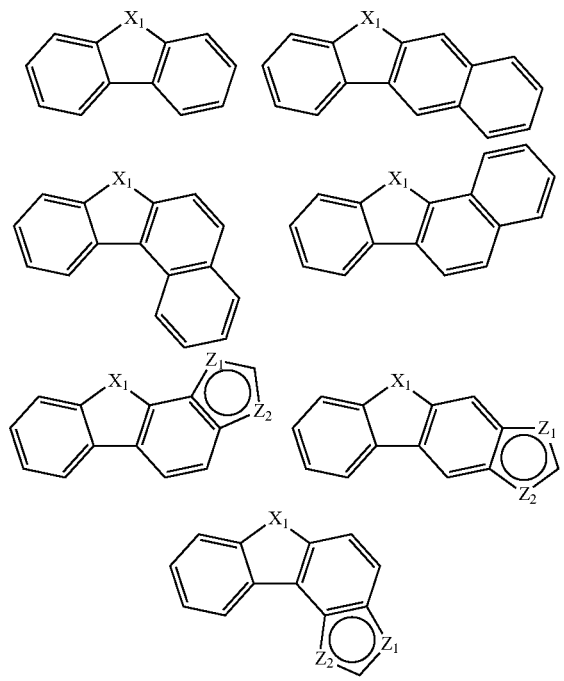

where the definition of $X_1$ may be the same as that of Chemical Formula 8, $Z_1$ and $Z_2$ may be the same as or different from each other, each independently being selected from the group consisting of O, S, Se, $N(Ar_6)$, $C(Ar_7)(Ar_{10})$, and $Si(Ar_9)(Ar_{10})$, $Ar_6$ to $Ar_{10}$ may be the same as or different from each other, and may each independently be selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, and the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of $Ar_6$ to $Ar_{10}$ may each independently be substituted or unsubstituted with one or more kinds of substituents selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

In an embodiment, since elements 10, 20, 30-32, 40, 51-52 of the organic EL device illustrated in FIG. 2 have configurations the same as those of FIG. 1 described above, respectively, individual descriptions thereof will be omitted.

The organic layer A and A' of the present invention composed as described above may further include an organic film layer (not illustrated) that blocks electrons and excitons between the hole transporting area 30 and the emissive layer 40, preferably between the hole transporting layer 32 and the emissive layer 40.

Such an organic film layer has a high LUMO value to prevent electrons from moving to the hole transporting layer 32 and has a high triplet energy to prevent the excitons of the emissive layer 40 from diffusing into the hole transporting layer 32. The material forming such an organic layer is not particularly limited, and examples thereof may include carbazole derivatives or arylamine derivatives.

A method of fabricating the organic layer A, A' of the present invention is not particularly limited, and non-limiting examples thereof may include a vacuum deposition method and a solution coating method. Examples of the solution coating method may include spin coating, dip coating, doctor blading, inkjet printing, thermal transferring and the like.

The organic EL devices 100 and 200 according to the present invention described above have a structure in which the anode 10, the organic layer A and A', and the cathode 20 are sequentially stacked, and an insulating layer or an adhesive layer may be further included between the anode 10 and the organic layer A and A' or between the cathode 20 and the organic layer A and A'. Such an organic EL device of the present invention may have excellent lifespan characteristics since the lifetime (e.g., half-time) of the initial brightness is increased while maintaining the maximum luminous efficiency when voltage, current, or both are applied.

Hereinafter, the present invention will be described in detail with reference to embodiments, but the following embodiments are merely illustrative of the present invention, and the present invention is not limited by the following embodiments.

[Preparation Example] Preparation of Compounds ET-01 to ET-21

Compounds represented by the following ET-01 to ET-21 were prepared as the compounds of the present invention, and their LUMO and $E_{HOMO}$-$E_{LUMO}$ were measured by methods known in the art, respectively, and are shown in Table 1 below.

For reference, $E_{HOMO}$-$E_{LUMO}$ was measured using a UV-Vis spectrophotometer (JASCO, V-500), and LUMO was calculated based on $E_{HUMO}$-$E_{LUMO}$ by measuring HOMO values using an electrochemical measurement equipment (Potentiostat/Galvanostat, Princeton, 273A) in a cyclic voltammetry (CV) method.

In such a case, Compounds ET-01 to ET-21 are shown below.

ET-01

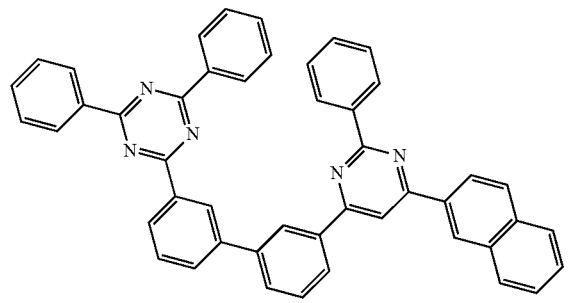

ET-02

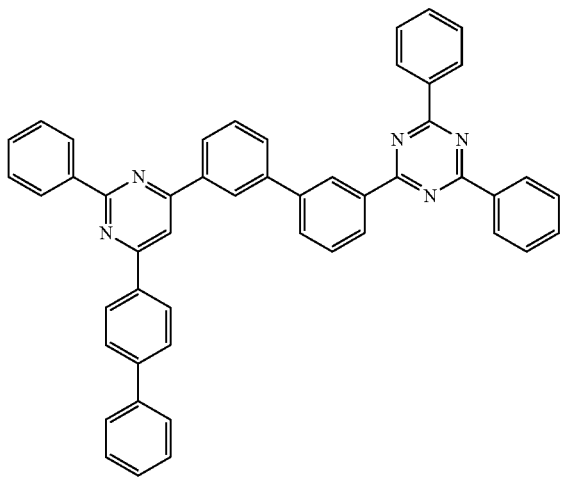

ET-03

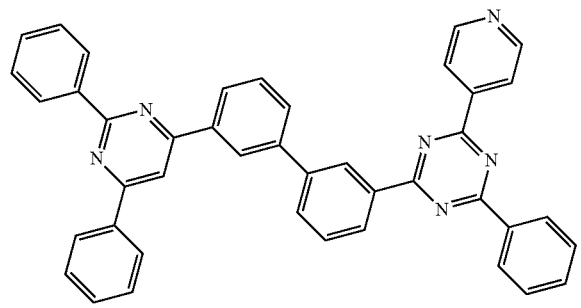

ET-04

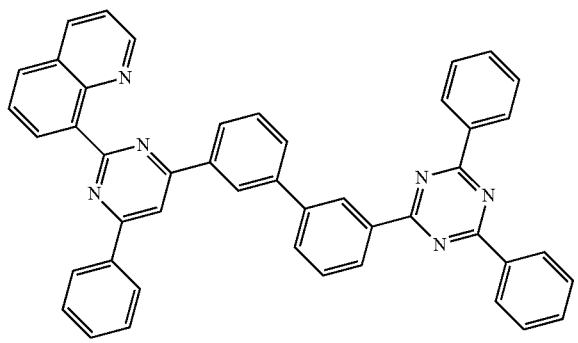

-continued
ET-05
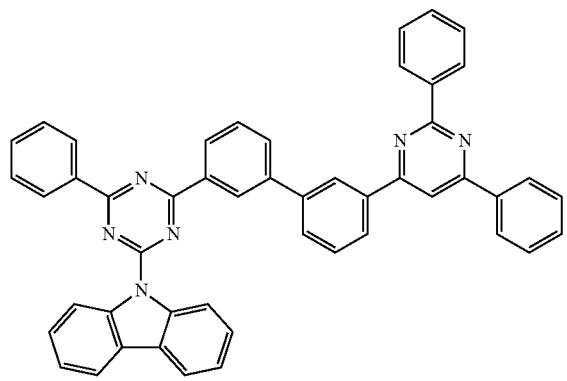
ET-06
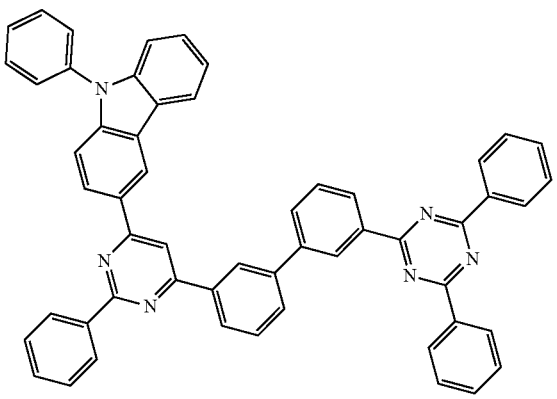
ET-07
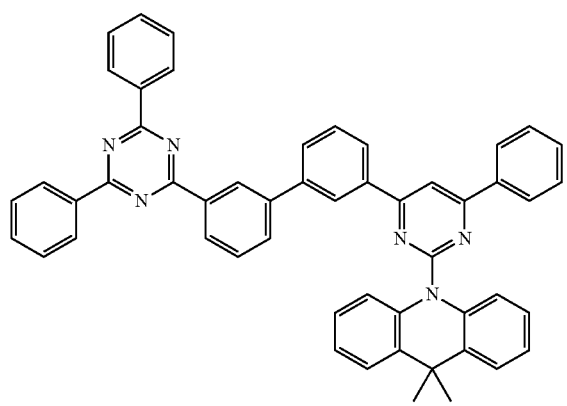
ET-08
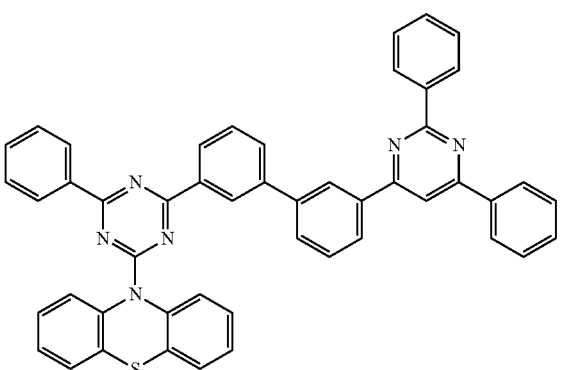
ET-09
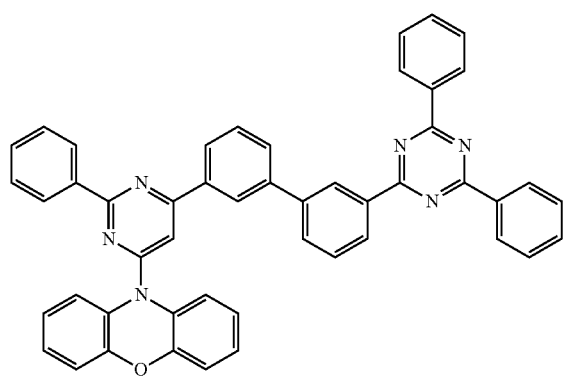
ET-10
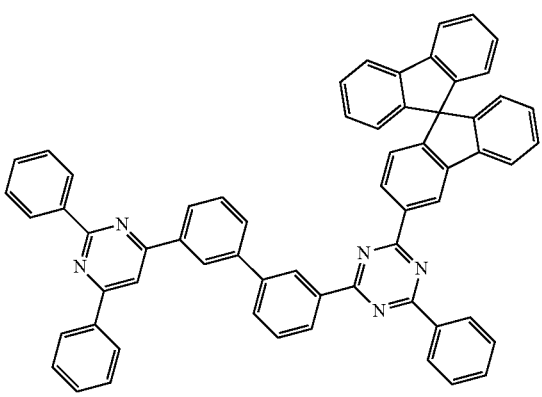
ET-11
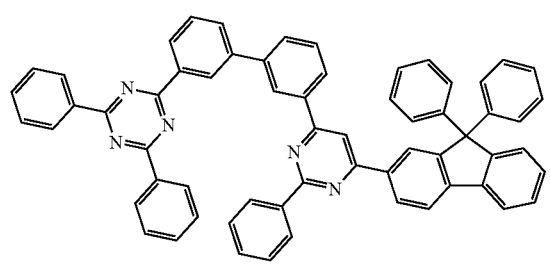
ET-12
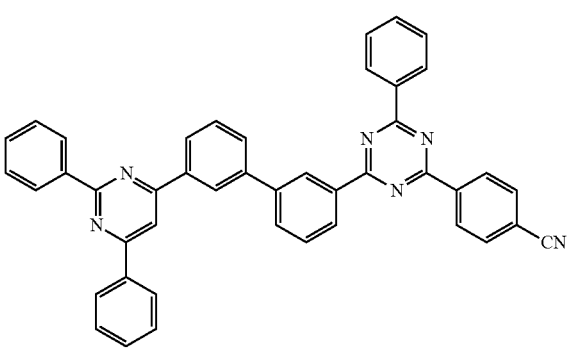

-continued
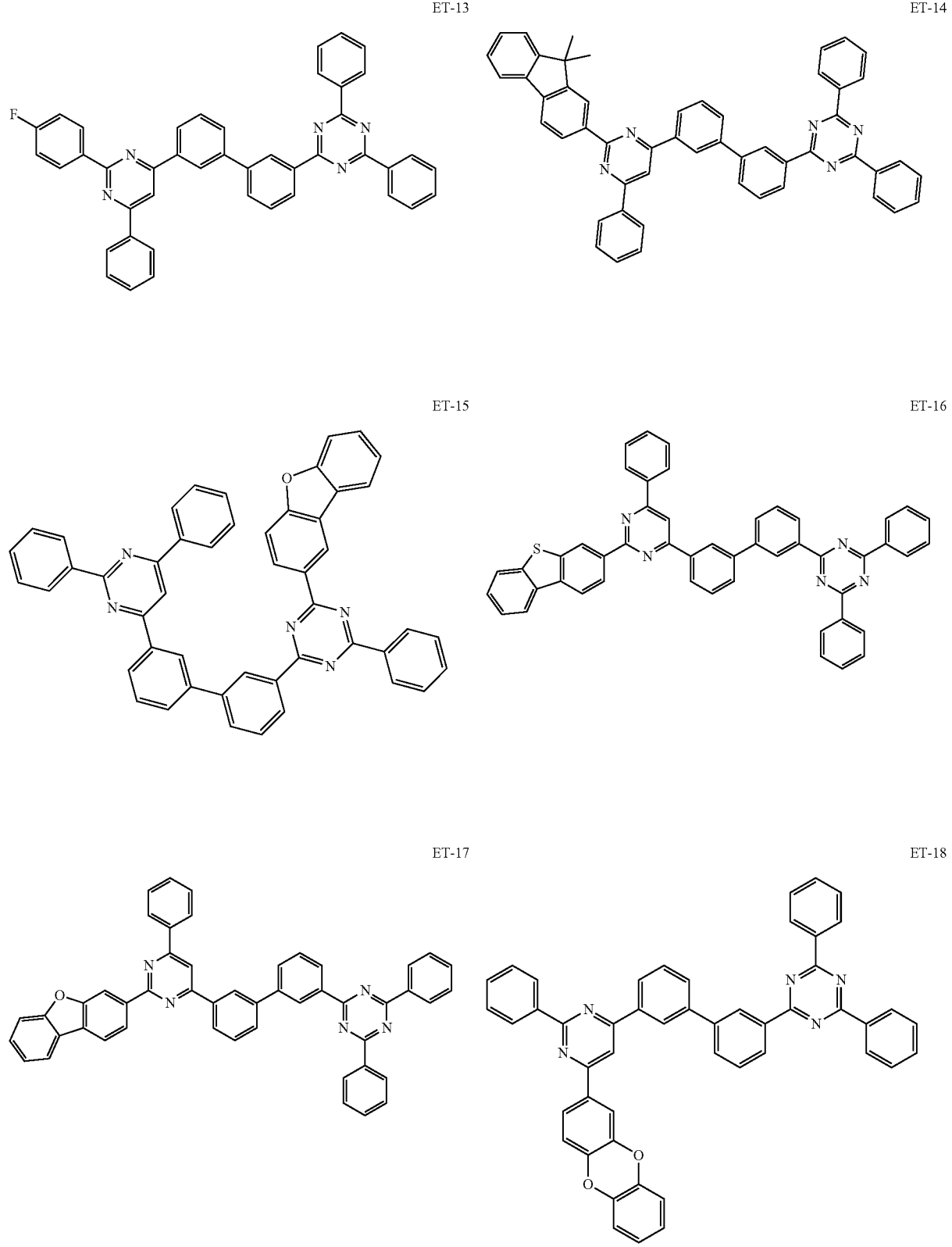

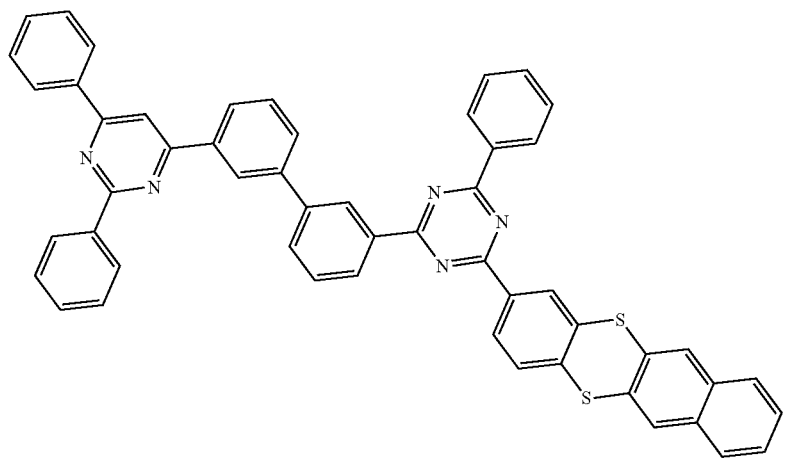
ET-19
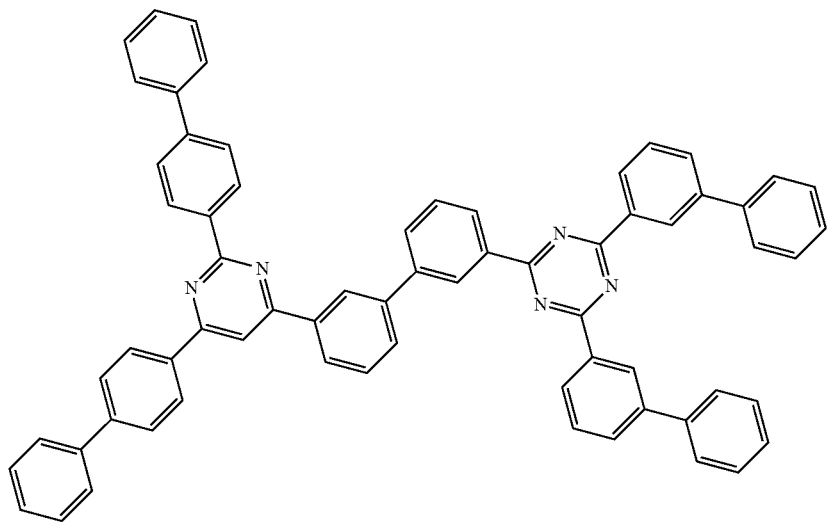
ET-20
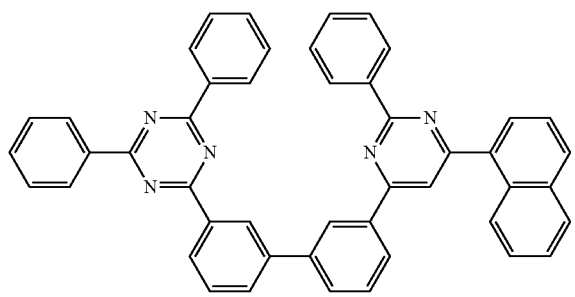
ET-21
| Compound | LUMO (eV) | $E_{HOMO}$-$E_{LUMO}$ (eV) |
| --- | --- | --- |
| ET-01 | 2.80 | 3.52 |
| ET-02 | 2.75 | 3.50 |
| ET-03 | 2.76 | 3.58 |
| ET-04 | 2.78 | 3.62 |
| ET-05 | 2.65 | 3.48 |
| ET-06 | 2.68 | 3.42 |
| ET-07 | 2.57 | 3.52 |
| ET-08 | 2.61 | 3.47 |
| ET-09 | 2.63 | 3.41 |
| ET-10 | 2.72 | 3.51 |
| ET-11 | 2.73 | 3.48 |
| ET-12 | 2.82 | 3.38 |
| ET-13 | 2.79 | 3.40 |
| ET-14 | 2.75 | 3.47 |
| ET-15 | 2.64 | 3.52 |
| ET-16 | 2.66 | 3.55 |
| ET-17 | 2.70 | 3.49 |
| ET-18 | 2.64 | 3.57 |
| ET-19 | 2.71 | 3.45 |
| ET-20 | 2.78 | 3.55 |
| ET-21 | 2.79 | 3.50 |

[Embodiments 1 to 21] Manufacturing of Blue Organic EL Device

A glass substrate that had been thin-film-coated with indium tin oxide (ITO) to a thickness of 1500 Å was washed ultrasonically with distilled water. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (80 nm)/NPB (15 nm)/ADN+5% DS-405 (30 nm)/ respective Compounds of Table 1 (30 nm)/ LiF (1 nm)/Al (200 nm) were stack in the order, so that organic EL devices were manufactured.

TABLE 2

|  | Compound | Thickness (nm) |
|---|---|---|
| Hole injection layer | DS-205 | 80 |
| Hole transporting layer | NPB | 15 |
| Emissive layer | ADN + 5% DS-405 | 30 |
| Electron transporting layer | ET-01~ET-21 | 30 |
| Electron injection layer | LiF | 1 |
| Cathode | Al | 200 |

[Comparative Example 1] Manufacturing of Blue Organic EL Device

A blue organic EL device was manufactured in the same manner as in Embodiment 1, except that Alq$_3$ was used as an electron transporting material instead of Compound 1 (ET-01).

[Comparative Example 2] Manufacturing of Blue Organic EL Device

A blue organic EL device was manufactured in the same manner as in Embodiment 1, except that compound T-1 was used as an electron transporting material instead of Compound 1 (ET-01).

[Comparative Example 3] Manufacturing of Blue Organic EL Device

A blue organic EL device was manufactured in the same manner as in Embodiment 1, except that compound T-2 was used as an electron transporting material instead of Compound 1 (ET-01).

The structures of NPB, ADN, Alq$_3$, T-1, and T-2 used in Embodiments 1 to 21 and Comparative Examples 1 to 3 are as follows.

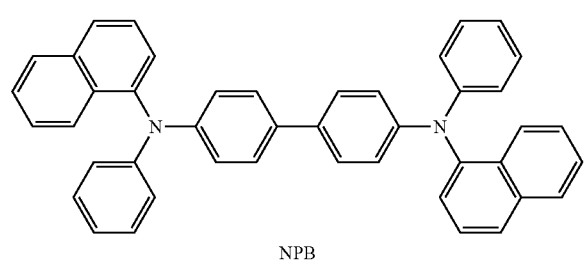

NPB

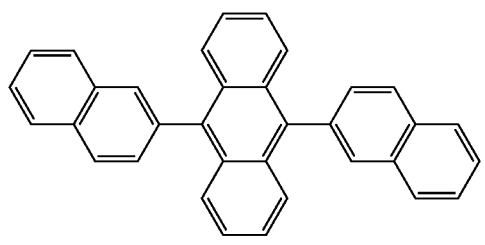

ADN

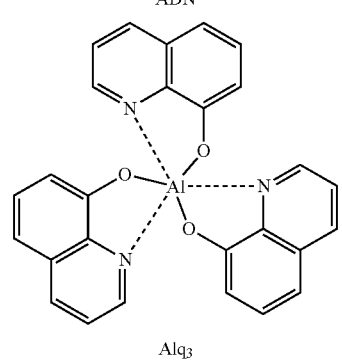

Alq$_3$

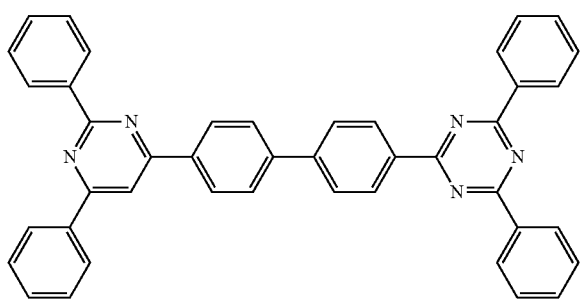

T-1

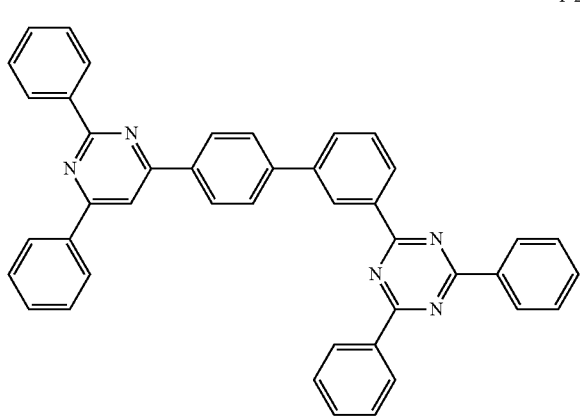

T-2

Experimental Example 1

For each of the blue organic EL devices manufactured in Embodiments 1 to 21 and Comparative Examples 1 to 3, a driving voltage, a current efficiency and a light emission peak at a current density of 10 mA/cm$^2$ were measured and the results are shown in Table 3 below.

TABLE 3

| Sample | Electron transporting layer | Driving voltage (V) | EL peak (nm) | Current efficiency (cd/A) |
|---|---|---|---|---|
| Embodiment 1 | ET-01 | 3.8 | 454 | 8.0 |
| Embodiment 2 | ET-02 | 3.5 | 456 | 8.9 |
| Embodiment 3 | ET-03 | 3.8 | 455 | 7.5 |
| Embodiment 4 | ET-04 | 4.1 | 453 | 7.9 |
| Embodiment 5 | ET-05 | 4.0 | 457 | 7.2 |
| Embodiment 6 | ET-06 | 3.9 | 453 | 8.1 |
| Embodiment 7 | ET-07 | 3.7 | 455 | 7.4 |
| Embodiment 8 | ET-08 | 4.0 | 457 | 7.6 |
| Embodiment 9 | ET-09 | 3.7 | 453 | 6.9 |
| Embodiment 10 | ET-10 | 3.8 | 455 | 7.2 |
| Embodiment 11 | ET-11 | 4.1 | 453 | 7.5 |
| Embodiment 12 | ET-12 | 4.0 | 453 | 7.7 |
| Embodiment 13 | ET-13 | 4.1 | 457 | 7.1 |
| Embodiment 14 | ET-14 | 3.8 | 455 | 8.1 |
| Embodiment 15 | ET-15 | 3.7 | 458 | 7.9 |
| Embodiment 16 | ET-16 | 3.9 | 457 | 7.8 |
| Embodiment 17 | ET-17 | 3.7 | 454 | 8.2 |
| Embodiment 18 | ET-18 | 3.9 | 453 | 7.9 |
| Embodiment 19 | ET-19 | 3.8 | 452 | 7.2 |
| Embodiment 20 | ET-20 | 4.0 | 455 | 7.8 |
| Embodiment 21 | ET-21 | 3.9 | 455 | 8.0 |
| Comparative example 1 | Alq3 | 5.4 | 458 | 5.5 |
| Comparative example 2 | T-1 | 4.5 | 459 | 5.9 |
| Comparative example 3 | T-2 | 4.4 | 458 | 6.0 |

As shown in Table 3, it was appreciated that the blue organic EL devices (Embodiments 1 to 21) in which the compounds of the present invention were used in the electron transporting layer exhibited excellent performance in terms of the driving voltage, the emission peak and the current efficiency, as compared to conventional blue organic EL devices (Comparative Examples 1 to 3) in which Alq$_3$, T-1, and T-2 were used in the electron transporting layer.

[Embodiments 22 to 40] Manufacturing of Blue Organic EL Device

A glass substrate that had been thin-film-coated with indium tin oxide (ITO) to a thickness of 1500 Å was washed ultrasonically with distilled water. After washing with distilled water was completed, the glass substrate was ultrasonically cleaned with a solvent, such as isopropyl alcohol, acetone and methanol, dried, transferred to a UV OZONE cleaner (Power sonic 405, Hwasin Tech) cleaned for 5 minutes using UV, and then transferred to a vacuum evaporator.

On the ITO transparent electrode prepared as above, DS-205 (80 nm)/NPB (15 nm)/ADN+5% DS-405 (30 nm)/respective LE-1 to LE-19 (5 nm)/respective electron transporting materials of Table 2 (25 nm)/LiF (1 nm)/Al (200 nm) were stack in the order, so that organic EL devices were manufactured.

TABLE 4

| | Compound | Thickness (nm) |
|---|---|---|
| Hole injection layer | DS-205 | 80 |
| Hole transporting layer | NPB | 15 |
| Emissive layer | ADN + 5% DS-405 | 30 |
| Auxiliary electron transporting layer | LE-1~LE-19 | 5 |
| Electron transporting layer | ET-01~ET-21 | 25 |
| Electron injection layer | LiF | 1 |
| Cathode | Al | 200 |

In such a case, Compounds LE-1 to LE-19 are shown below.

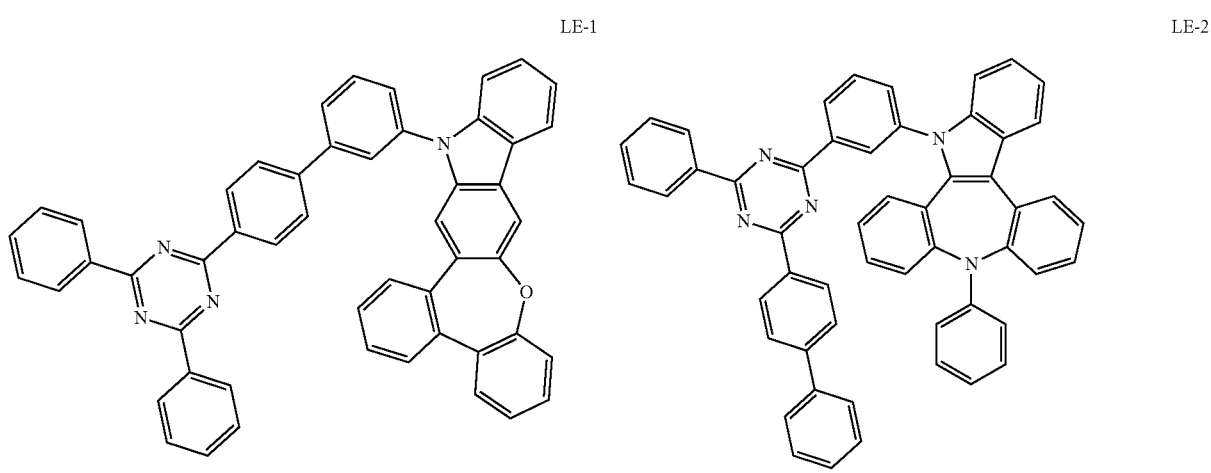

LE-1

LE-2

LE-3
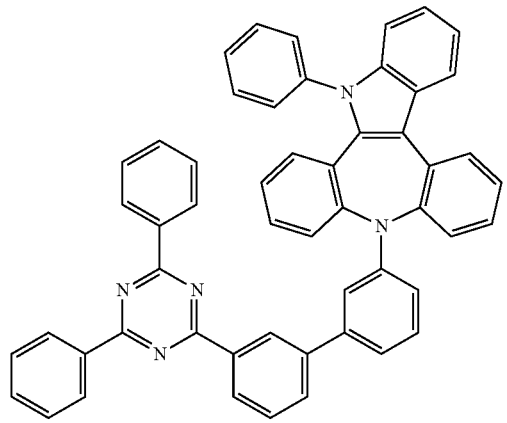
LE-4
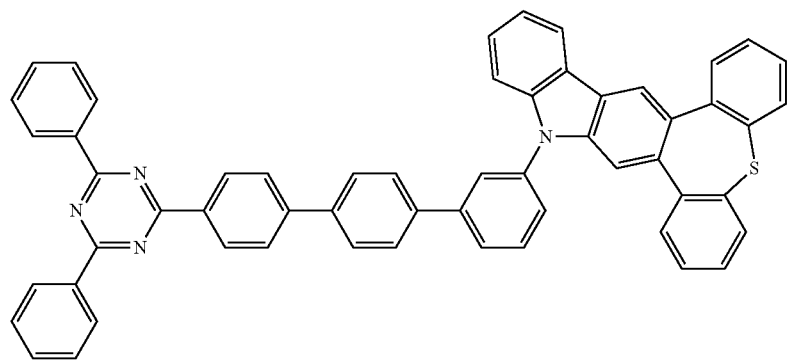
LE-5
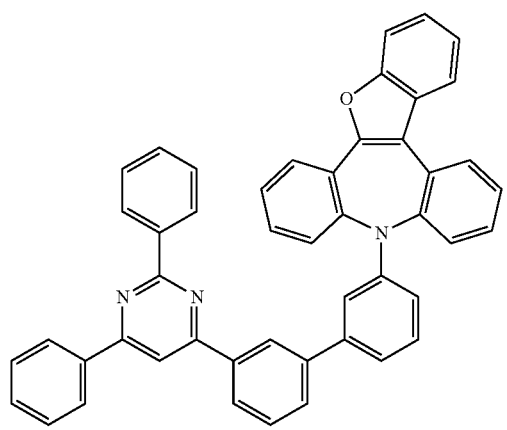
LE-6
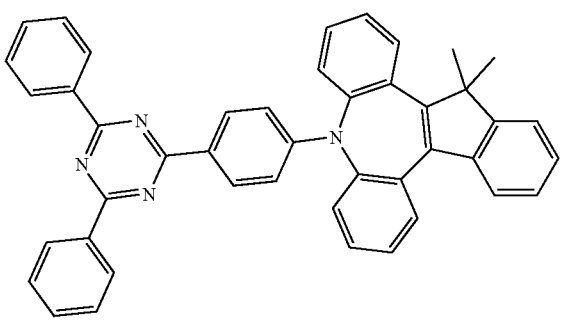
LE-7
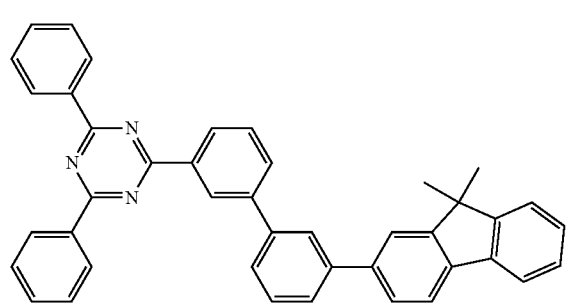

LE-8
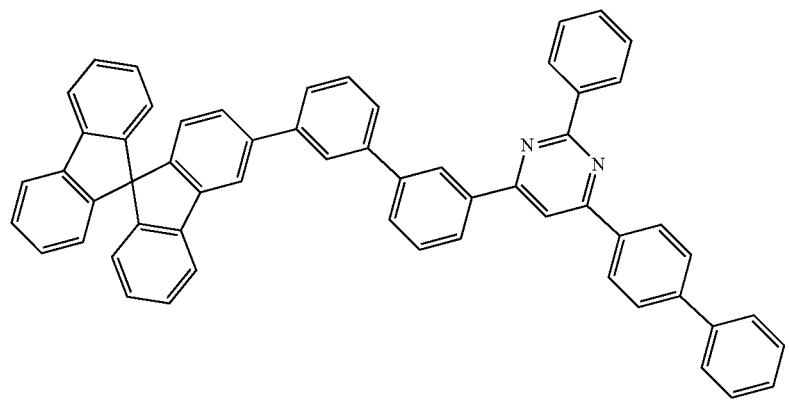
LE-9  LE-10
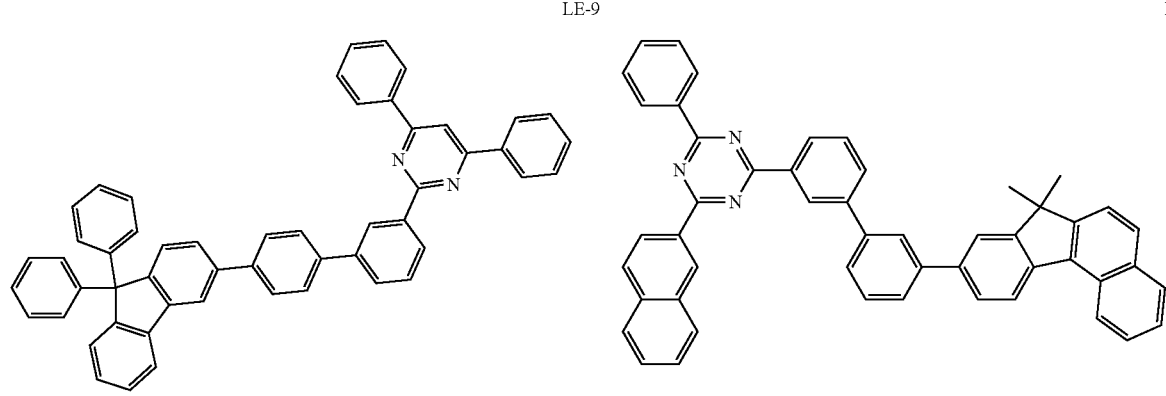
LE-11  LE-12
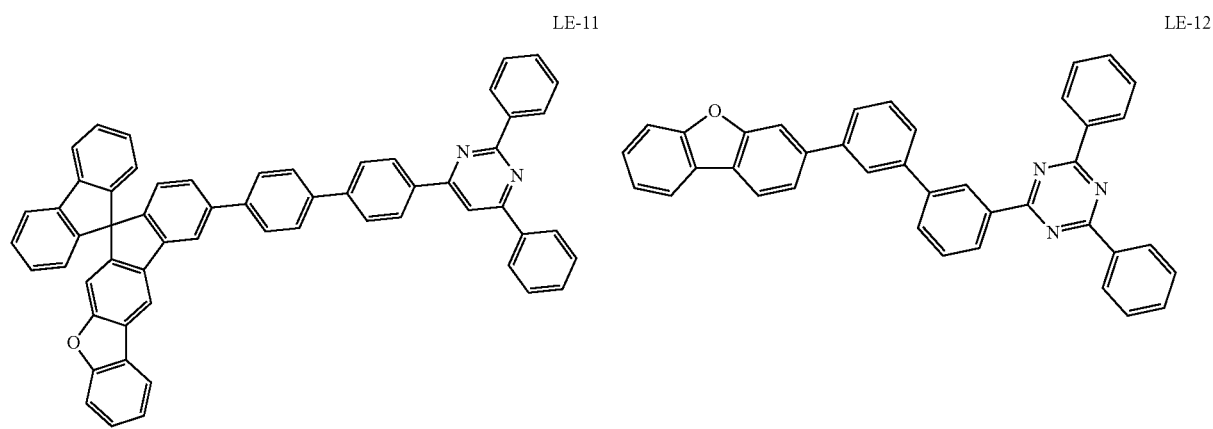

LE-13
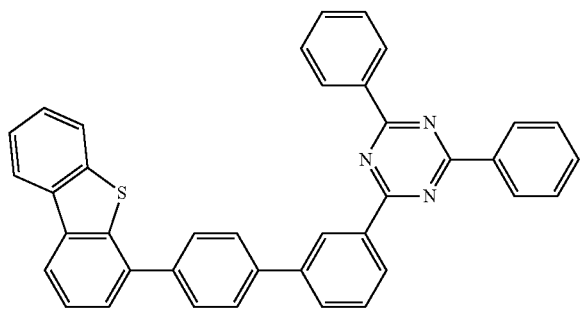
LE-14
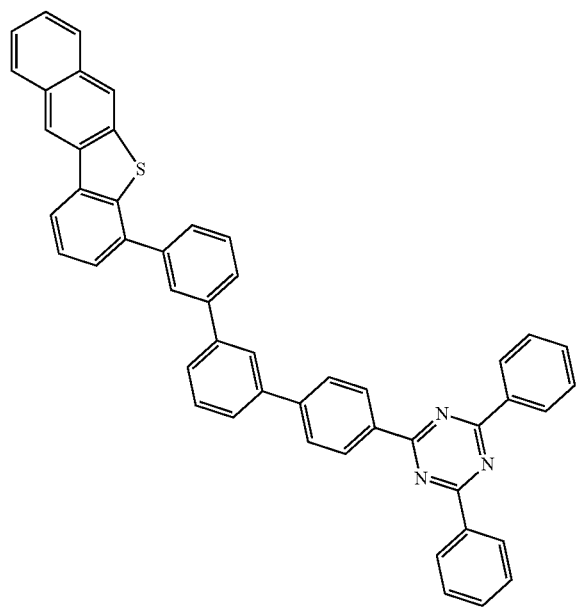
LE-15
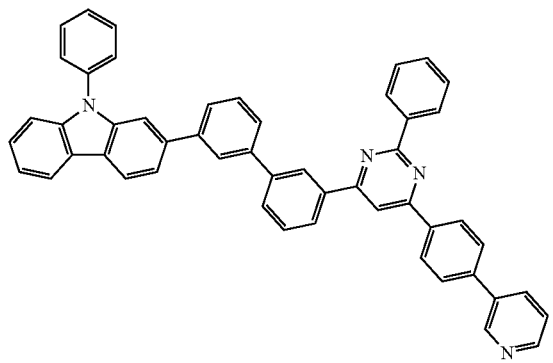
LE-16
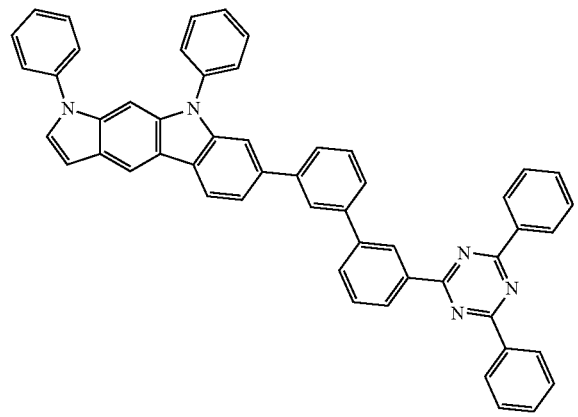
LE-17
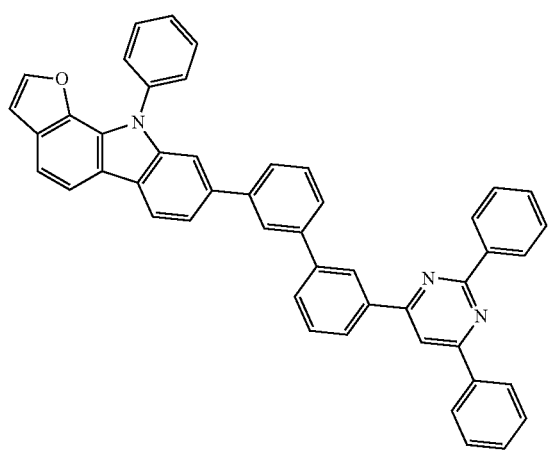
LE-18
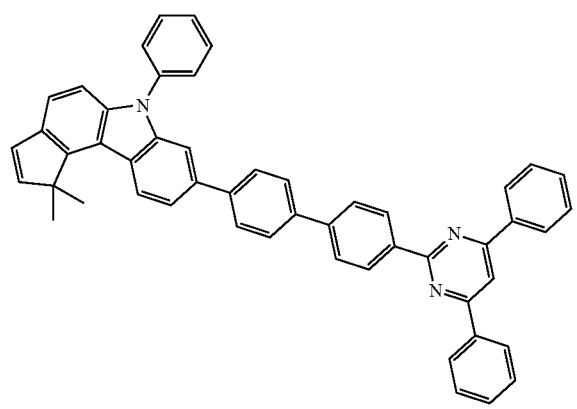

LE-19

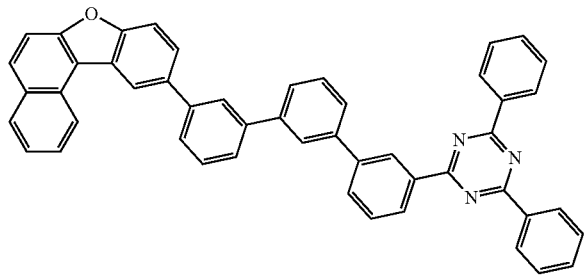

Experimental Example 2

For each of the blue organic EL devices manufactured in Embodiments 22 to 40, a driving voltage, a current efficiency and a light emission peak at a current density of 10 mA/cm² were measured and the results are shown in Table 5 below.

TABLE 5

| Sample | Auxiliary electron transporting layer | Electron transporting layer | Driving voltage (V) | EL peak (nm) | Current efficiency (cd/A) |
|---|---|---|---|---|---|
| Embodiment 22 | LE-1 | ET-01 | 3.6 | 457 | 8.3 |
| Embodiment 23 | LE-2 | ET-03 | 3.5 | 455 | 7.8 |
| Embodiment 24 | LE-3 | ET-02 | 3.2 | 456 | 9.2 |
| Embodiment 25 | LE-4 | ET-05 | 3.4 | 457 | 7.3 |
| Embodiment 26 | LE-5 | ET-17 | 3.3 | 454 | 8.5 |
| Embodiment 27 | LE-6 | ET-11 | 3.6 | 453 | 7.9 |
| Embodiment 28 | LE-7 | ET-02 | 3.2 | 456 | 9.3 |
| Embodiment 29 | LE-8 | ET-06 | 3.5 | 453 | 8.4 |
| Embodiment 30 | LE-9 | ET-17 | 3.3 | 454 | 8.7 |
| Embodiment 31 | LE-10 | ET-13 | 3.5 | 457 | 7.5 |
| Embodiment 32 | LE-11 | ET-14 | 3.7 | 455 | 8.4 |
| Embodiment 33 | LE-12 | ET-02 | 3.3 | 456 | 9.0 |
| Embodiment 34 | LE-13 | ET-05 | 3.6 | 457 | 7.7 |
| Embodiment 35 | LE-14 | ET-18 | 3.4 | 453 | 8.1 |
| Embodiment 36 | LE-15 | ET-02 | 3.2 | 456 | 9.1 |
| Embodiment 37 | LE-16 | ET-17 | 3.4 | 454 | 8.8 |
| Embodiment 38 | LE-17 | ET-11 | 3.6 | 453 | 7.7 |
| Embodiment 39 | LE-18 | ET-12 | 3.5 | 453 | 8.0 |
| Embodiment 40 | LE-19 | ET-02 | 3.1 | 456 | 9.2 |
| Comparative example 1 | LE-01 | T-1 | 4.2 | 459 | 6.2 |
| Comparative example 2 | LE-09 | T-2 | 4.1 | 458 | 6.4 |

Referring to Table 5, it was appreciated that when the electron transporting layer and the auxiliary electron transporting layer including the compounds of the present invention are used together, excellent performance is achieved in terms of the driving voltage, the emission peak and the current efficiency as compared to Comparative Examples 1 and 2.

The invention claimed is:
1. An organic electroluminescent device, comprising:
a stack structure in which an anode, a hole transporting area; an emissive layer; an electron transporting area; and a cathode are sequentially stacked,
wherein the electron transporting area comprises an electron transporting layer and an electron injection layer,
wherein the electron transporting layer comprises a compound represented by the following Chemical Formula 1:

Chemical Formula 1

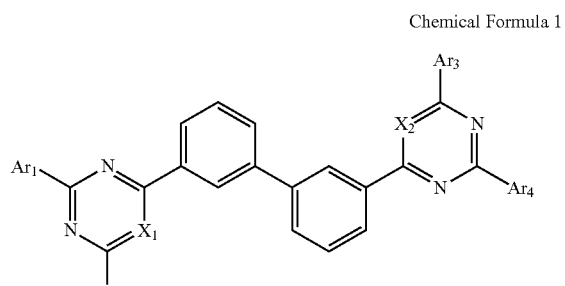

wherein in Chemical Formula 1,
one of $X_1$ and $X_2$ is $CR_1$ and the other thereof is N,
$R_1$ is selected from the group consisting of hydrogen, deuterium, halogen, a cyano group, a $C_1$ to $C_{40}$ alkyl group, a $C_6$ to $C_{60}$ aryl group and a heteroaryl group having 5 to 60 nuclear atoms;
$Ar_1$ to $Ar_4$ are each independently selected from the group consisting of: a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, while a case where all of $Ar_1$ to $Ar_4$ are the same as each other is excluded, and
the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, halogen, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other, with the proviso that the heteroaryl group having 5 to 60 nuclear atoms as $R_1$ or $Ar_1$ to $Ar_4$ is not

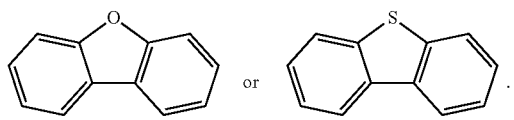 [SMILES: c1ccc2c(c1)oc1ccccc12 ; c1ccc2c(c1)sc1ccccc12]

2. The organic electroluminescent device of claim 1, wherein the compound represented by Chemical Formula 1 is represented by the following Chemical Formula 2 or 3:

Chemical Formula 2

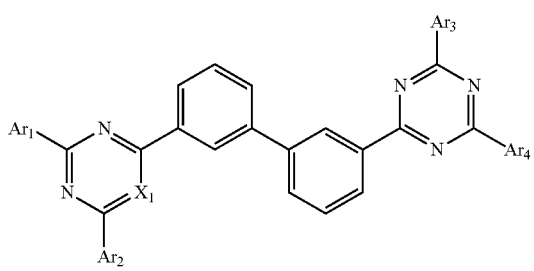

Chemical Formula 3

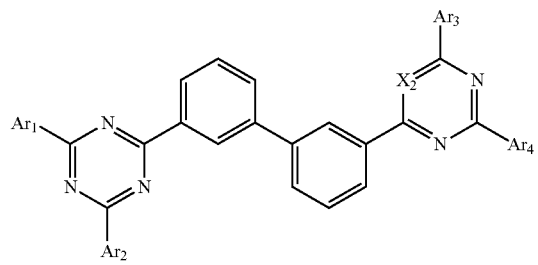

wherein $X_1$ and $X_2$ are each $CR_1$, and $R_1$ and $Ar_1$ to $Ar_4$ are the same as those defined in claim 1, respectively.

3. The organic electroluminescent device of claim 1, wherein $Ar_1$ to $Ar_4$ are each independently selected from the group consisting of a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, wherein the alkyl group, the aryl group, the heteroaryl group, the aryloxy group, the arylphosphine oxide group and the arylamine group of $Ar_1$ to $Ar_4$ are each independently substituted or unsubstituted with one or more kinds of substituents selected from the group consisting of deuterium, halogen, a cyano group, a nitro group, a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and wherein when the substituents are plural in number, the substituents are the same as or different from each other.

4. The organic electroluminescent device of claim 1, wherein the compound represented by Chemical Formula 1 has a LUMO of 2.5 eV or more.

5. The organic electroluminescent device of claim 1, wherein the compound represented by Chemical Formula 1 has an energy difference ($E_{HOMO}$-$E_{LUMO}$) between HOMO and LUMO of 3.2 eV or more.

6. The organic electroluminescent device of claim 1, wherein the electron transporting area is co-deposited with an n-type dopant.

7. The organic electroluminescent device of claim 1, wherein the compound represented by Chemical Formula 1 is represented by one of the following ET-01 to ET-14, and ET-18 to ET-21:

ET-01

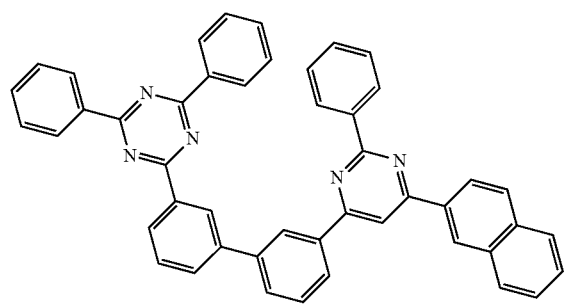

ET-02

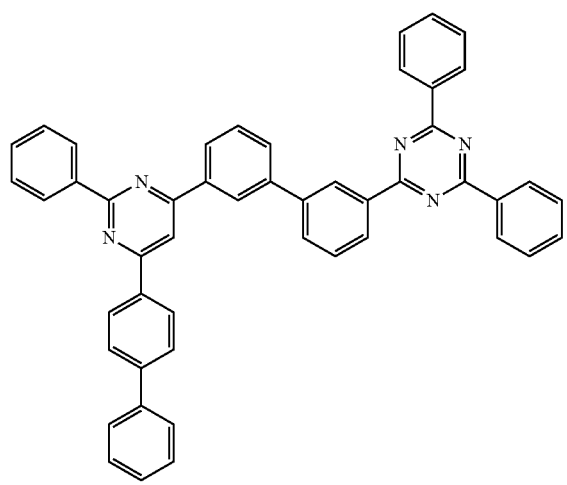

-continued
ET-03
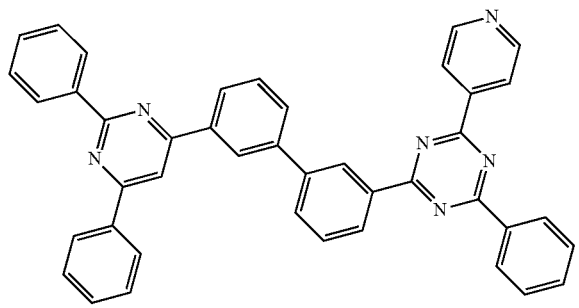
ET-04
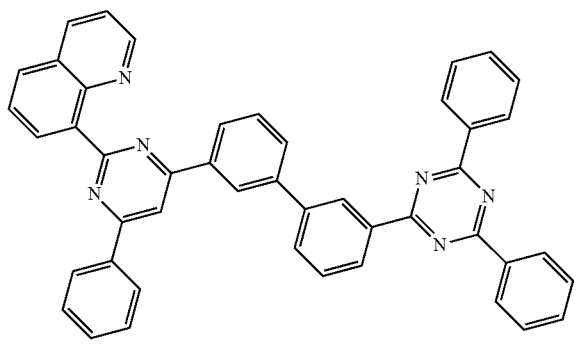
ET-05
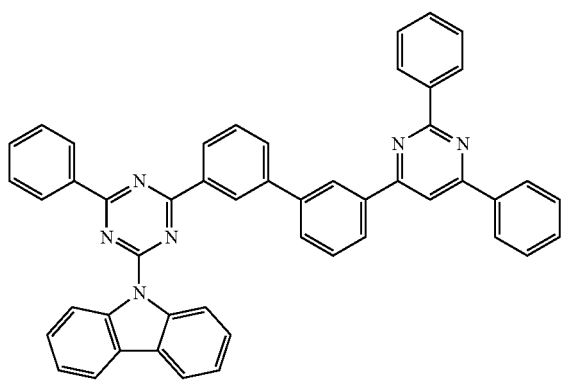
ET-06
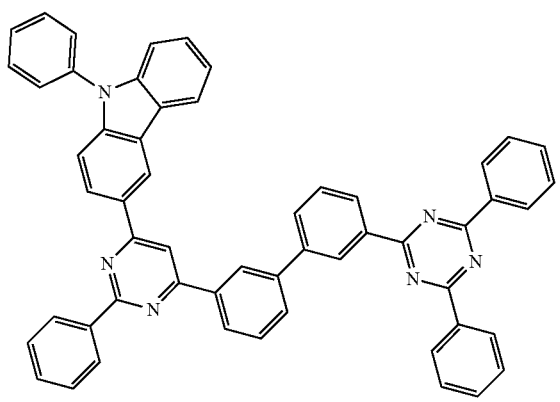
ET-07
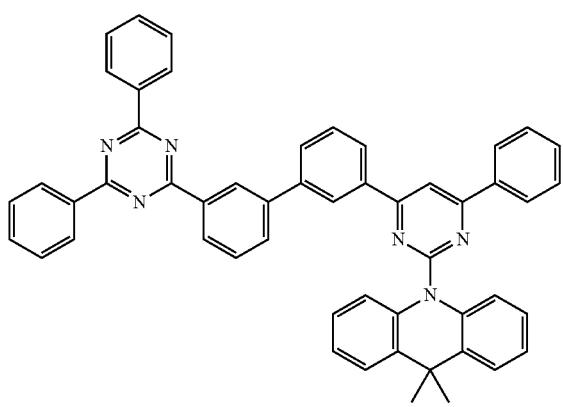
ET-08
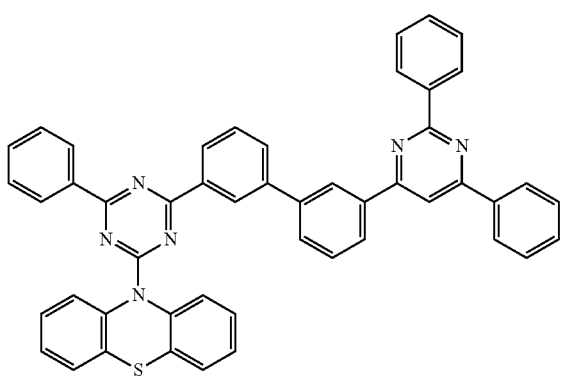
ET-09
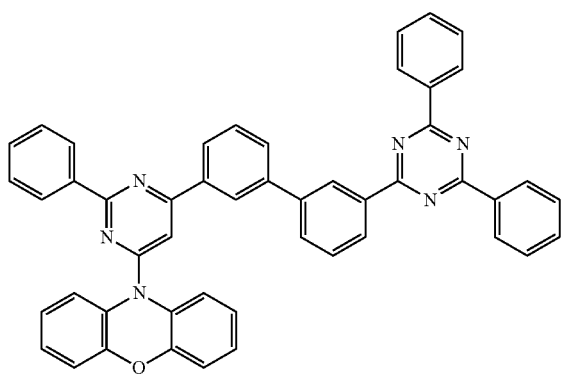
ET-10
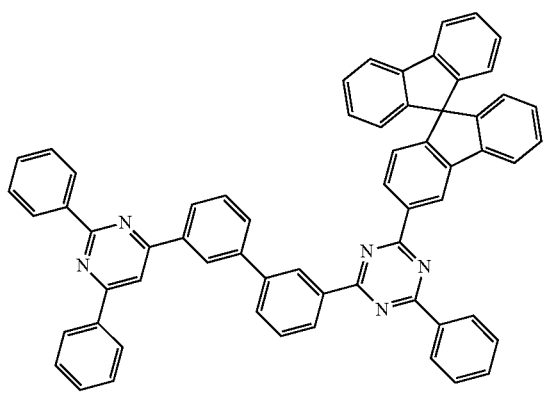

ET-11
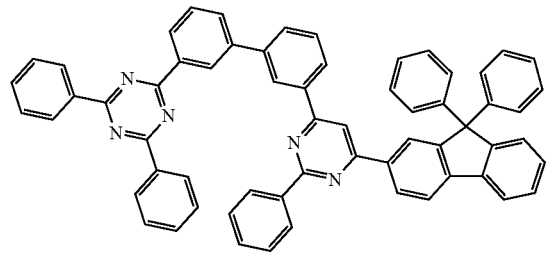
ET-12
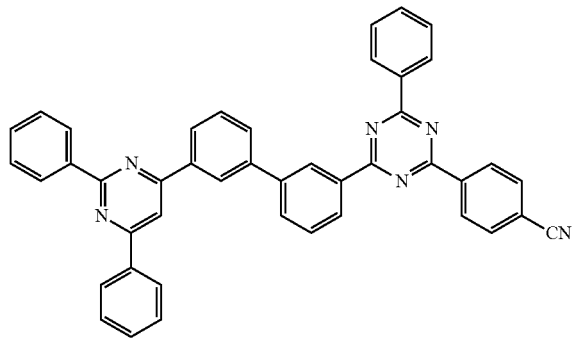
ET-13
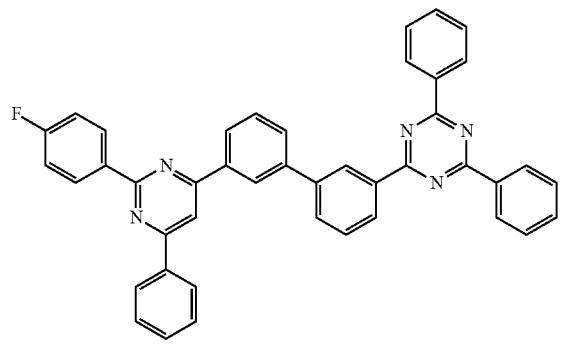
ET-14
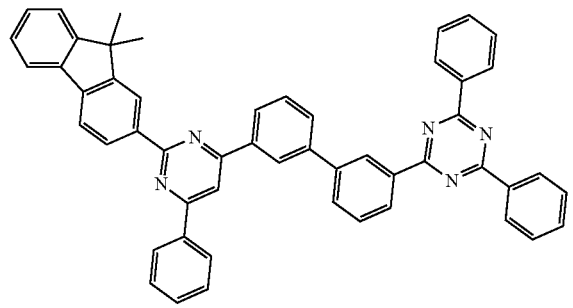
ET-18
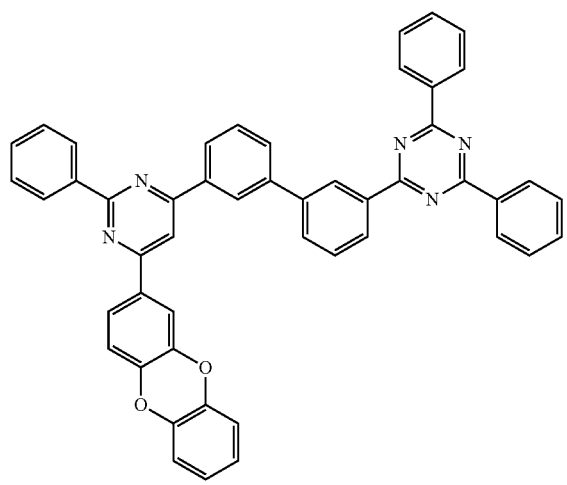

-continued

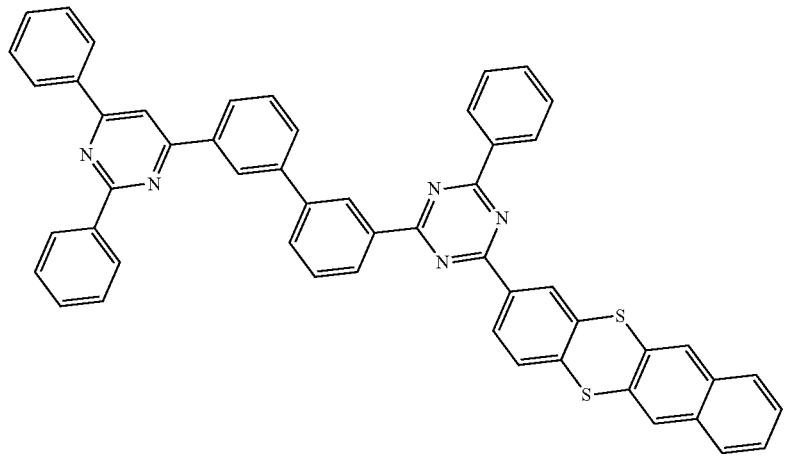

ET-19

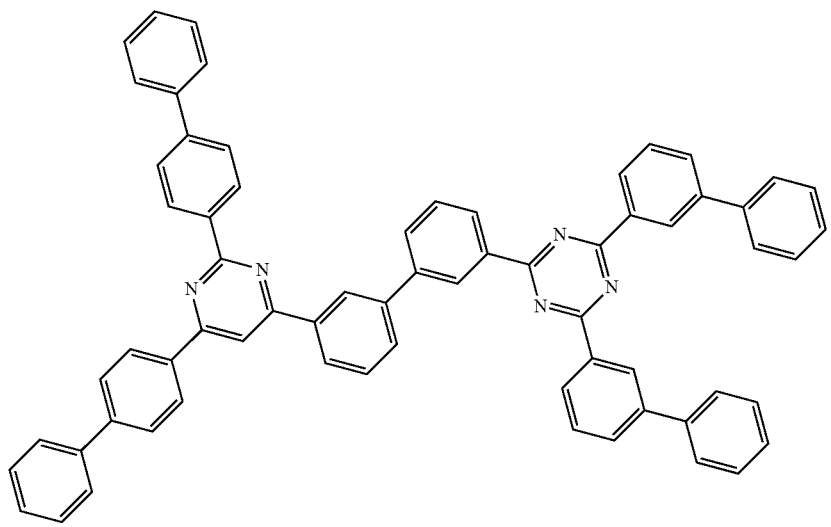

ET-20

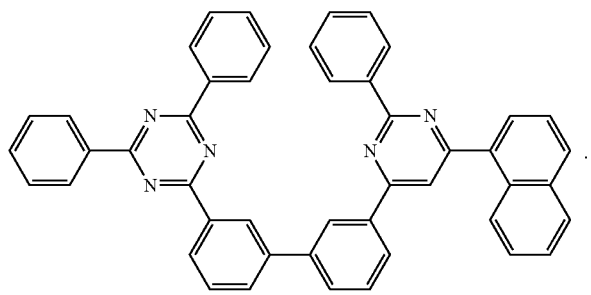

ET-21

8. An organic electroluminescent device, comprising:

a stack structure in which an anode, a hole transporting area; an emissive layer; an electron transporting area; and a cathode are sequentially stacked, wherein the electron transporting area comprises an auxiliary electron transporting layer, an electron transporting layer and an electron injection layer, wherein the electron transporting layer comprises a compound represented by the following Chemical Formula 1:

Chemical Formula 1

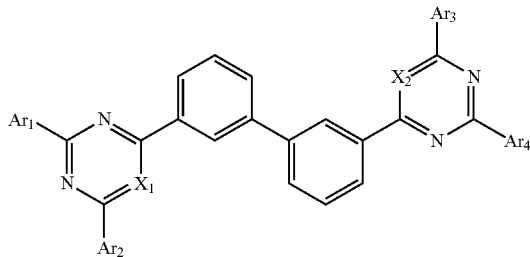

wherein in Chemical Formula 1,
one of $X_1$ and $X_2$ is $CR_1$ and the other thereof is N,
$R_1$ is selected from the group consisting of hydrogen, deuterium, halogen, a cyano group, a $C_1$ to $C_{40}$ alkyl group, a $C_6$ to $C_{60}$ aryl group and a heteroaryl group having 5 to 60 nuclear atoms;
$Ar_1$ to $Ar_4$ are each independently selected from the group consisting of: a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, while a case where all of $Ar_1$ to $Ar_4$ are the same as each other is excluded, and
the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, halogen, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other,
with the proviso that the heteroaryl group having 5 to 60 nuclear atoms as $R_1$ or $Ar_1$ to $Ar_4$ is not

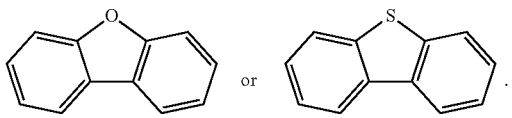

9. The organic electroluminescent device of claim 8, wherein the compound represented by Chemical Formula 1 is represented by the following Chemical Formula 2 or 3:

Chemical Formula 2

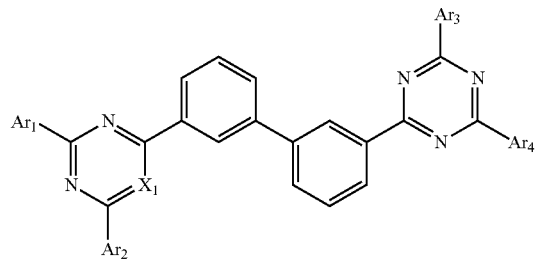

Chemical Formula 3

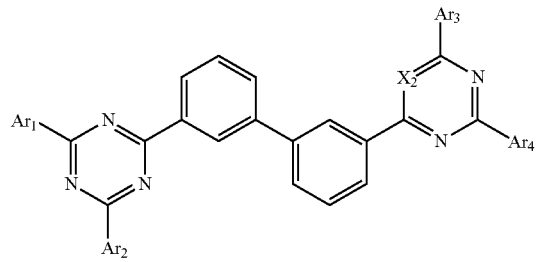

wherein
$X_1$ and $X_2$ are each $CR_1$, and $R_1$ has the same as those defined in claim 8, and
$Ar_1$ to $Ar_4$ are each independently selected from the group consisting of: a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, while a case where all of $Ar_1$ to $Ar_4$ are the same as each other is excluded, and
the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the arylphosphine group, the arylphosphine oxide group and the arylamine group of $R_1$ and $Ar_1$ to $Ar_4$ are each independently substituted or unsubstituted with one or more kinds of substituents selected from the group consisting of deuterium, halogen, a cyano group, a nitro group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_1$ to $C_{40}$ alkyl group, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_6$ to $C_{60}$ arylphosphine group, a $C_6$ to $C_{60}$ arylphosphine oxide group and a $C_6$ to $C_{60}$ arylamine group, and when the substituents are plural in number, the substituents are the same as or different from each other.

10. The organic electroluminescent device of claim 8, wherein $Ar_1$ to $Ar_4$ are each independently selected from the group consisting of a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, wherein the alkyl group, the aryl group, the heteroaryl group, the aryloxy group, the arylphosphine oxide group and the arylamine group of $Ar_1$ to $Ar_4$ are each independently substituted or unsubstituted with one or more kinds of substituents selected from the group consisting of deuterium, halogen, a cyano group, a nitro group, a $C_1$ to $C_{40}$ alkyl group, a $C_6$ to $C_{60}$ aryl group, a heteroaryl group having 5 to 60 nuclear atoms, a $C_6$ to $C_{60}$ aryloxy group, a $C_6$ to $C_{60}$ arylphosphine oxide group and a $C_6$ to $C_{60}$ arylamine group, and wherein when the substituents are plural in number, the substituents are the same as or different from each other.

11. The organic electroluminescent device of claim 8, wherein the compound represented by Chemical Formula 1 has a LUMO of 2.5 eV or more.

12. The organic electroluminescent device of claim 8, wherein the compound represented by Chemical Formula 1 has an energy difference ($E_{HOMO}$-$E_{LUMO}$) between HOMO and LUMO of 3.2 eV or more.

13. The organic electroluminescent device of claim 8, wherein the electron transporting area is co-deposited with an n-type dopant.

14. The organic electroluminescent device of claim 8, wherein the compound represented by Chemical Formula 1 is represented by one of the following ET-01 to ET-14 and ET-18 to ET-21:

ET-01

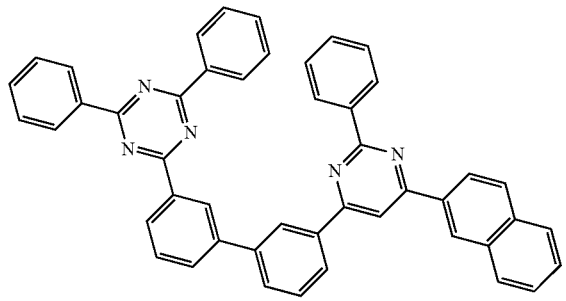

ET-02

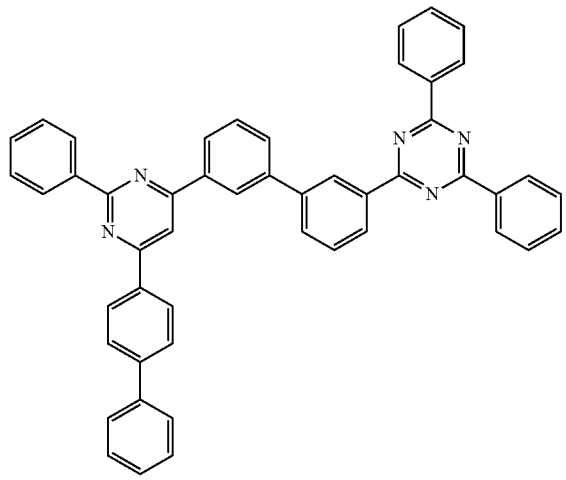

ET-03

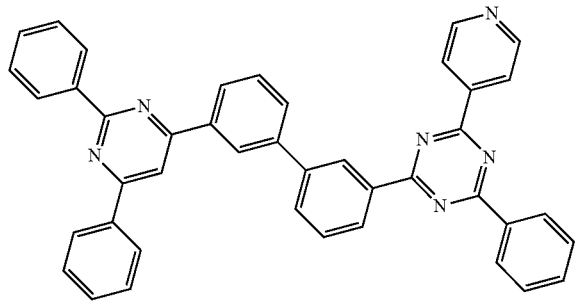

ET-04

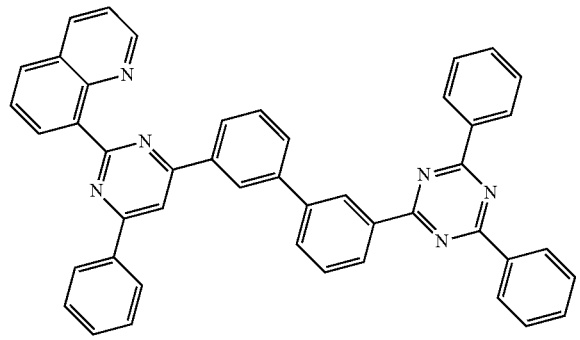

-continued
ET-05
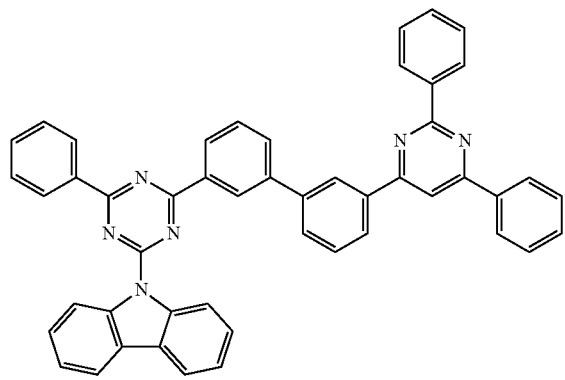
ET-06
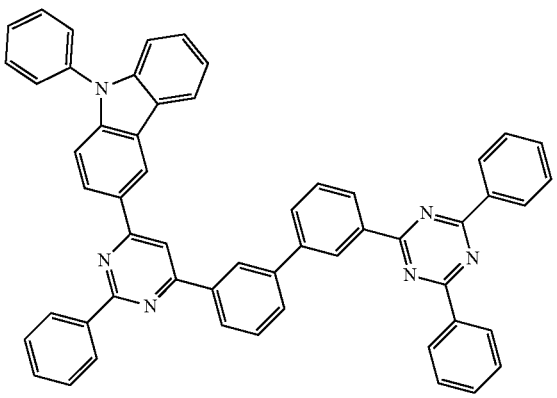
ET-07
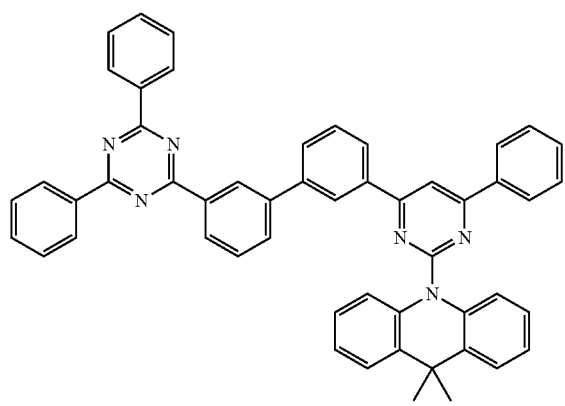
ET-08
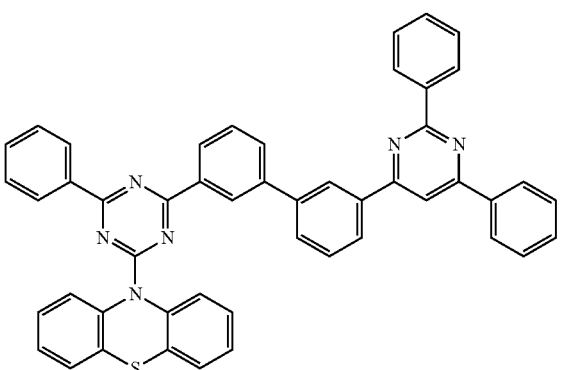
ET-09
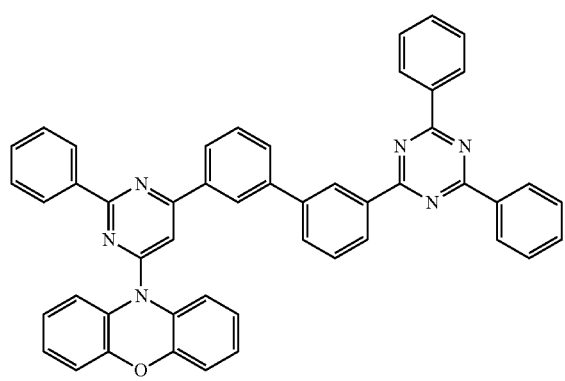
ET-10
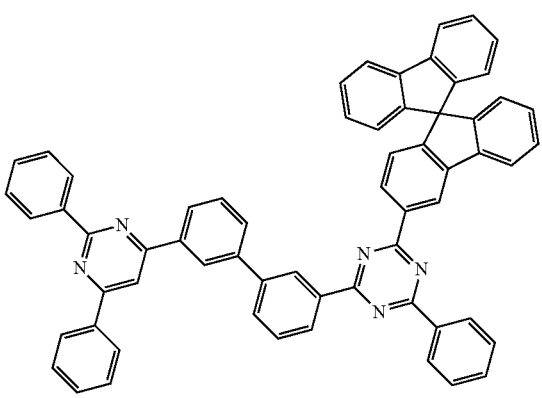
ET-11
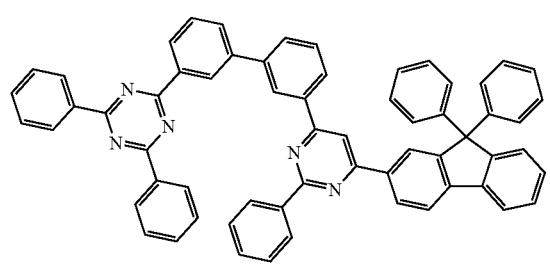
ET-12
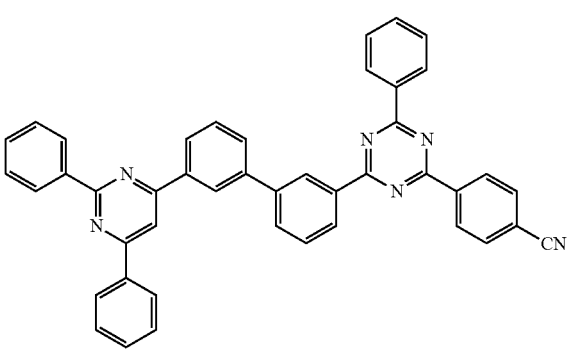

-continued
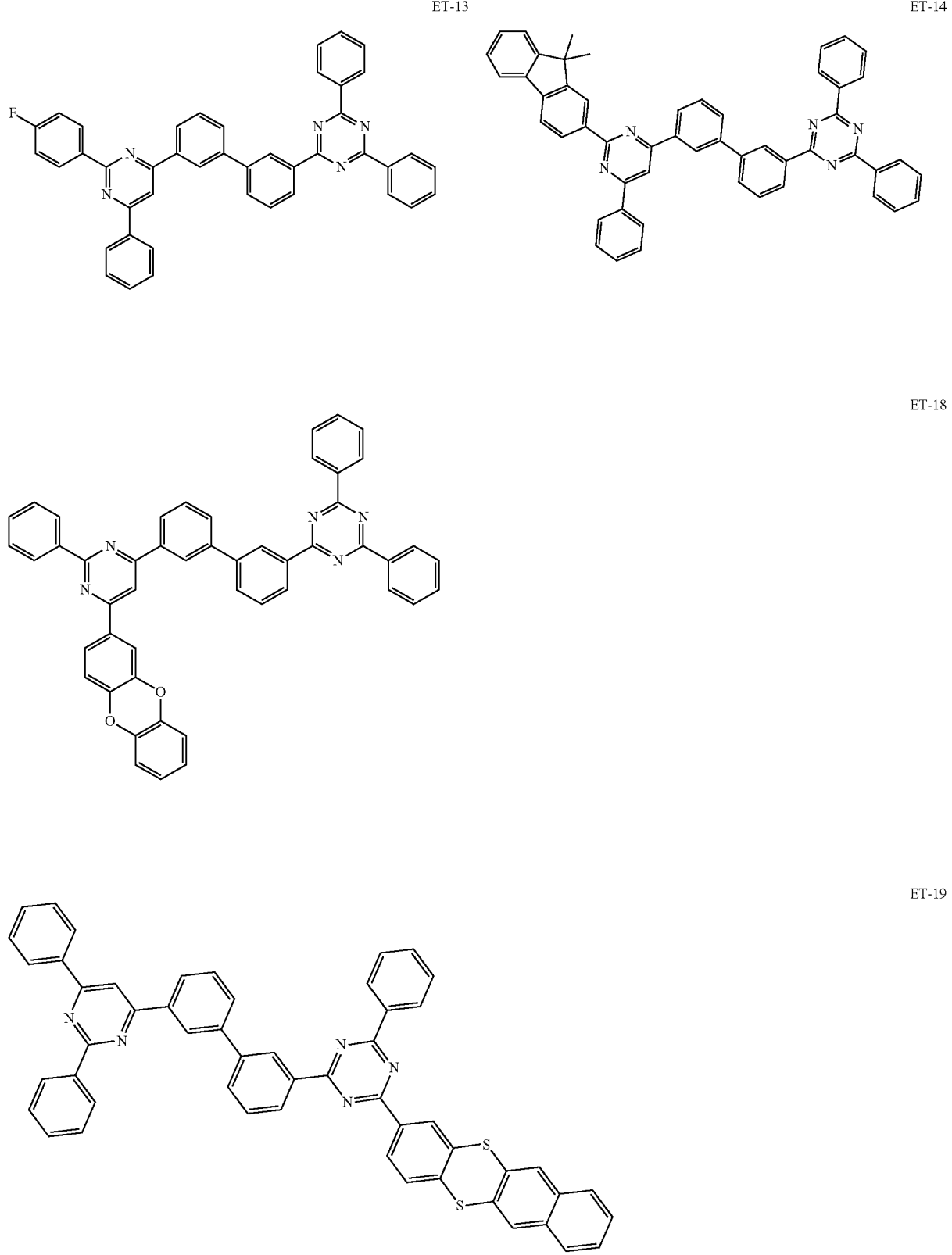
ET-13
ET-14
ET-18
ET-19

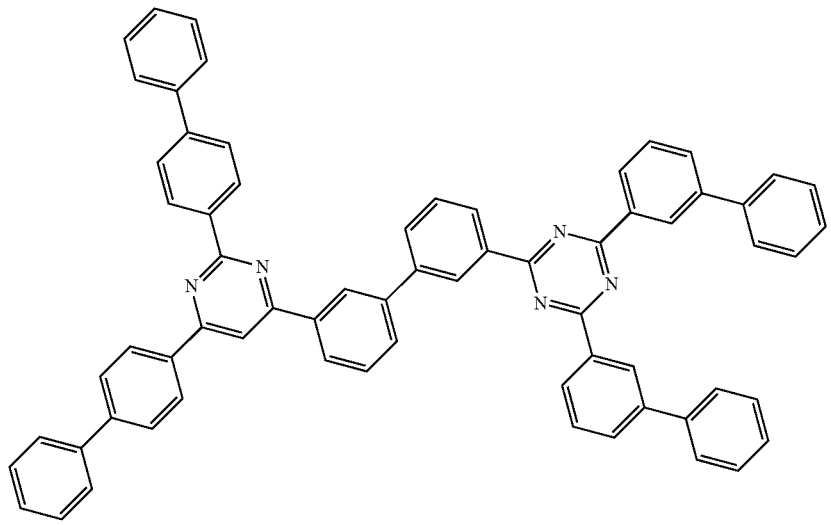

ET-20

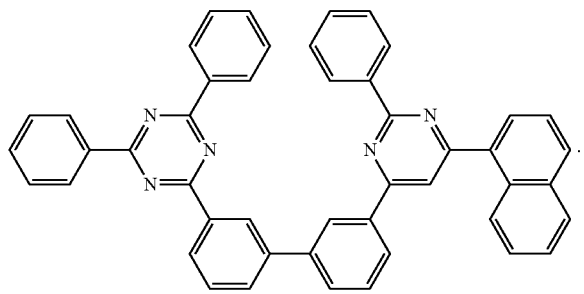

ET-21

15. The organic electroluminescent device of claim 8, wherein the auxiliary electron transporting layer has (i) an ionization potential of 5.5 eV or more, and (ii) $E_{HOMO} - E_{LUMO} \geq 3.0$ eV.

16. The organic electroluminescent device of claim 8, wherein the auxiliary electron transporting layer comprises a bipolar compound having both an electron withdrawing group (EWG) and an electron donating group (EDG), and
wherein the bipolar compound has (iii) ΔEst<0.5 eV (ΔEst representing a difference between a singlet energy (S1) and a triplet energy (T1) of the compound).

17. The organic electroluminescent device of claim 16, wherein the bipolar compound comprises an EWG moiety represented by the following Chemical Formula 4:

Chemical Formula 4

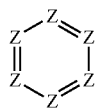

wherein in Chemical Formula 4,
Z are the same as or different from each other, each independently being C(R) or N, and at least one of Z is N,
a plurality of R are the same as or different from each other, each independently being selected from the group consisting of: hydrogen, deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{60}$ aryl group, a heteroaryl group having 5 to 60 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group, or form a condensed ring with an adjacent group, and
the alkyl group, the alkenyl group, the alkynyl group, the cycloalkyl group, the heterocycloalkyl group, the aryl group, the heteroaryl group, the alkyloxy group, the aryloxy group, the alkylsilyl group, the arylsilyl group, the alkylboron group, the arylboron group, the phosphine group, the phosphine oxide group and the arylamine group of R are each independently substituted or unsubstituted with one or more kinds of substituents selected from the group consisting of deuterium, a halogen group, a cyano group, a nitro group, an amino group, a $C_1$ to $C_{40}$ alkyl group, a $C_2$ to $C_{40}$ alkenyl group, a $C_2$ to $C_{40}$ alkynyl group, a $C_3$ to $C_{40}$ cycloalkyl group, a heterocycloalkyl group having 3 to 40 nuclear atoms, a $C_6$ to $C_{40}$ aryl group, a heteroaryl group having 5 to 40 nuclear atoms, a $C_1$ to $C_{40}$ alkyloxy group, a $C_6$ to $C_{60}$ aryloxy group, a $C_1$ to $C_{40}$ alkylsilyl group, a $C_6$ to $C_{60}$ arylsilyl group, a $C_1$ to $C_{40}$ alkylboron group, a $C_6$ to $C_{60}$ arylboron group, a $C_1$ to $C_{40}$ phosphine group, a $C_1$ to $C_{40}$ phosphine oxide group, and a $C_6$ to $C_{60}$ arylamine group.

18. The organic electroluminescent device of claim 17, wherein the moiety represented by Chemical Formula 4 is selected from the structure represented by the following Chemical Formula:

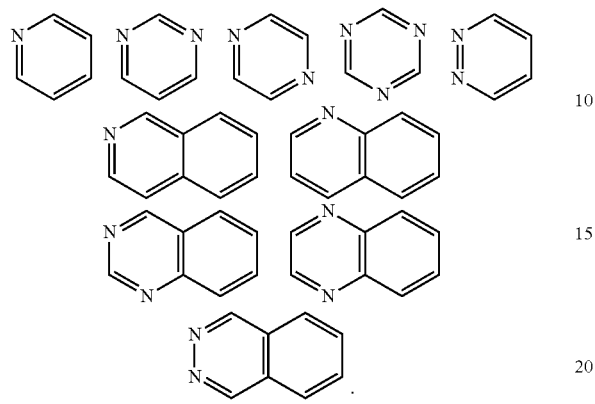

19. The organic electroluminescent device of claim 16, wherein the electron donating group (EDG) included in the bipolar compound is an EDG moiety having an electron donating property greater than that of the electron withdrawing group (EWG).

* * * * *